(12) United States Patent
Fujita et al.

(10) Patent No.: US 8,158,324 B2
(45) Date of Patent: Apr. 17, 2012

(54) POSITIVE-TYPE PHOTOSENSITIVE RESIN COMPOSITION

(75) Inventors: Yoji Fujita, Otsu (JP); Shinji Arimoto, Otsu (JP); Rinsei Ike, Otsu (JP)

(73) Assignee: TORAY Industries, Inc., Tokyo (JP)

( * ) Notice: Subject to any disclaimer, the term of this patent is extended or adjusted under 35 U.S.C. 154(b) by 252 days.

(21) Appl. No.: 12/449,527

(22) PCT Filed: Feb. 5, 2008

(86) PCT No.: PCT/JP2008/051799
§ 371 (c)(1),
(2), (4) Date: Aug. 12, 2009

(87) PCT Pub. No.: WO2008/099709
PCT Pub. Date: Aug. 21, 2008

(65) Prior Publication Data
US 2010/0099041 A1    Apr. 22, 2010

(30) Foreign Application Priority Data

Feb. 13, 2007 (JP) .................................. 2007-31710
Mar. 12, 2007 (JP) .................................. 2007-61542

(51) Int. Cl.
*G03F 7/023* (2006.01)
(52) U.S. Cl. ......... 430/191; 430/165; 430/192; 430/193
(58) Field of Classification Search .................. 430/165, 430/191, 192, 193
See application file for complete search history.

(56) References Cited

U.S. PATENT DOCUMENTS

| | | | |
|---|---|---|---|
| 5,114,826 A * | 5/1992 | Kwong et al. | 430/192 |
| 5,486,447 A * | 1/1996 | Hammerschmidt et al. | 430/197 |
| 6,376,151 B1 * | 4/2002 | Takahashi et al. | 430/192 |
| 6,929,890 B2 * | 8/2005 | Miyoshi et al. | 430/7 |
| 6,929,891 B2 * | 8/2005 | Rushkin et al. | 430/18 |
| 6,933,087 B2 * | 8/2005 | Suwa et al. | 430/7 |
| 7,416,830 B2 * | 8/2008 | Naiini et al. | 430/190 |
| 2004/0142275 A1 * | 7/2004 | Komatsu | 430/270.1 |
| 2006/0110680 A1 | 5/2006 | Taniguchi et al. | 430/270.1 |

FOREIGN PATENT DOCUMENTS

| | | |
|---|---|---|
| EP | 1 132 773 A1 | 9/2001 |
| EP | 1 365 289 A1 | 11/2003 |
| EP | 1 496 395 A2 | 1/2005 |
| JP | 2000-338666 A | 12/2000 |
| JP | 2005-062764 A | 3/2005 |
| JP | 2005062764 * | 3/2005 |
| JP | 2005-250160 A | 9/2005 |
| JP | 2005-266673 A | 9/2005 |
| JP | 2005-352004 A | 12/2005 |
| JP | 2005352004 * | 12/2005 |
| JP | 2006-178437 A | 7/2006 |
| JP | 2006-276094 A | 10/2006 |
| JP | 2006-285037 A | 10/2006 |
| JP | 2006285037 * | 10/2006 |

OTHER PUBLICATIONS

Supplementary European Search Report issued in EP 08 71 0777.

\* cited by examiner

*Primary Examiner* — John Chu
(74) *Attorney, Agent, or Firm* — Kubovcik & Kubovcik

(57) ABSTRACT

A positive-type photosensitive resin composition, including:
(a) a novolac resin;
(b) a polymer including, as a main component, a structure represented by formula (1) and/or formula (2):

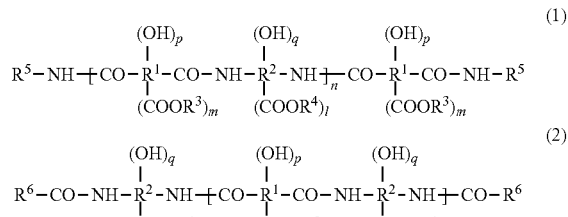

(wherein $R^1$ and $R^2$ may be the same or different and each represent an organic group having at least two carbon atoms and a valence of 2 to 8, $R^3$ and $R^4$ may be the same or different and each represent hydrogen or a monovalent organic group of 1 to 20 carbon atoms, —NH—$R^5$ in formula (1) and —CO—$R^6$ in formula (2) each represent a polymer end group, $R^5$ and $R^6$ each represent a monovalent organic group having 2 to 30 carbon atoms which includes an unsaturated hydrocarbon group, n is in the range of 10 to 100,000, l and m each represent an integer of 0 to 2, and p and q each represent an integer of 0 to 4, provided that p+q>0;
(c) a quinone diazide compound;
(d) an alkoxymethyl group-containing compound; and
(e) a solvent.

5 Claims, 1 Drawing Sheet

POSITIVE-TYPE PHOTOSENSITIVE RESIN COMPOSITION

This application is a 371 of international application PCT/JP2008/051799, filed Feb. 5, 2008, which claims priority based on Japanese patent application Nos. 2007-31710 and 2007-61542 filed Feb. 13, 2007, and Mar. 12, 2007, respectively, and which is incorporated herein by reference.

TECHNICAL FIELD

The invention relates to a positive-type photosensitive resin composition. More specifically, the invention relates to a positive-type photosensitive resin composition that is suitable for surface protective films for semiconductor devices, interlayer dielectric films, insulating layers for organic electro-luminescent devices, and so on, and the portion of which exposed to ultraviolet light becomes soluble in alkaline developing solutions.

BACKGROUND ART

Heat-resistant resins such as polyimide and polybenzoxazole have a high level of heat resistance and electrical insulating properties and therefore are used for surface protective films for semiconductor devices such as LSI (Large Scale Integration) and interlayer dielectric films. In recent years, as semiconductor devices become finer, surface protective films, interlayer dielectric films and so on, have been required to be formed at a resolution of few μm. In such applications, therefore, positive-type photosensitive polyimide or polybenzoxazole which can be subjected to fine processes is used.

On the other hand, there is proposed a positive-type photosensitive resin composition comprising novolac resin, which is widely used for photoresists, and a polyimide precursor or a polybenzoxazole precursor, and a quinone diazide compound (see for example Patent Document 1). However, thermally cured films produced with such a resin composition are very brittle and insufficient in mechanical properties, particularly in elongation or strength, as compared with those of conventional polyimide or polybenzoxazole. There are also proposed positive-type photosensitive resin compositions comprising a novolac resin, and a polyamide precursor or a polybenzoxazole precursor, and a quinone diazide compound, and a polyfunctional methylol compound (see for example Patent Documents 2 to 4). However, such resin compositions have poor mechanical properties or storage stability and the problem of significant changes in sensitivity. For these reasons, it has been difficult to use these resin compositions in place of photosensitive polyimide or polybenzoxazole in such applications as surface protective films for semiconductor devices and interlayer dielectric films.

Patent Document 1: Japanese Patent Application Laid-Open (JP-A) No. 2005-352004 (claim 1)
Patent Document 2: JP-A No. 2005-062764 (claim 1)
Patent Document 3: JP-A No. 2005-250160 (claim 1)
Patent Document 4: JP-A No. 2006-285037 (claim 1)

DISCLOSURE OF INVENTION

Problem to be Solved by the Invention

An object of the invention is to provide a positive-type photosensitive resin composition that is produced with novolac resin and has good mechanical properties and high storage stability.

Means for Solving the Problems

The invention is directed to a positive-type photosensitive resin composition comprising: (a) a novolac resin; (b) a polymer comprising, as a main component, a structure represented by formula (1) and/or a structure represented by formula (2); (c) a quinone diazide compound; (d) an alkoxymethyl group-containing compound; and (e) a solvent.

[Formula 1]

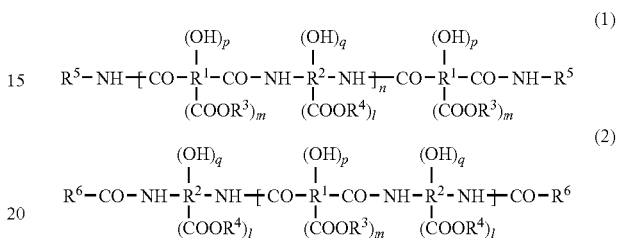

In formulae (1) and (2), $R^1$ and $R^2$ may be the same or different and each represent an organic group having at least two carbon atoms and a valence of 2 to 8, $R^3$ and $R^4$ may be the same or different and each represent hydrogen or a monovalent organic group of 1 to 20 carbon atoms, —NH—$R^5$ in formula (1) and —CO—$R^6$ in formula (2) each represent a polymer end group, $R^5$ and $R^6$ each represent a monovalent organic group having 2 to 30 carbon atoms which includes an unsaturated hydrocarbon group, n is in the range of 10 to 100,000, l and m each represent an integer of 0 to 2, and p and q each represent an integer of 0 to 4, provided that p+q>0.

Effects of the Invention

According to the invention, there is provided a positive-type photosensitive resin composition having good mechanical properties and high storage stability.

BEST MODE FOR CARRYING OUT THE INVENTION

Figure 1:
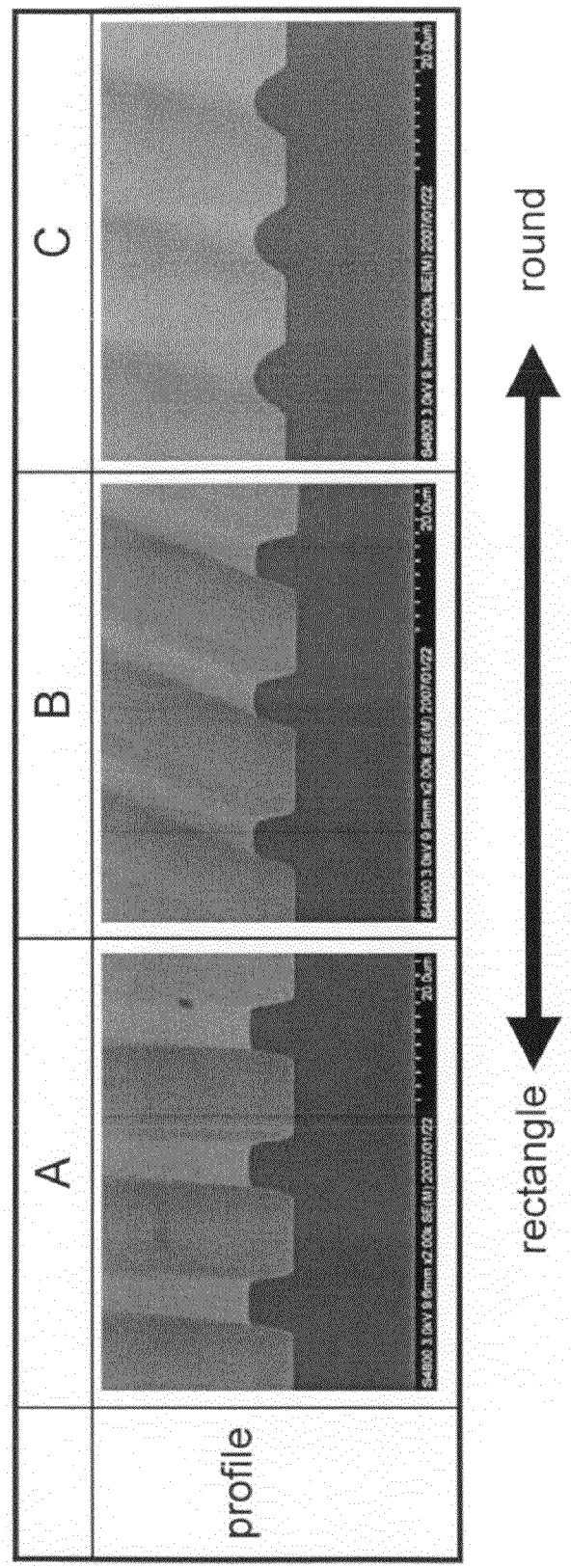
FIG. 1 shows criteria for evaluation of pattern profile Characteristics after heat curing.

The positive-type photosensitive resin composition of the invention contains (a) a novolac resin and (b) a polymer comprising, as a main component, the structure represented by formula (1) and/or the structure represented by formula (2).

The novolac resin (a) may be obtained by polycondensation of phenols and aldehydes according to known methods. The composition may contain a combination of two or more types of novolac resins.

Preferred examples of the phenols above include phenol, o-cresol, m-cresol, p-cresol, 2,3-xylenol, 2,5-xylenol, 3,4-xylenol, 3,5-xylenol, 2,3,5-trimethylphenol, and 3,4,5-trimethylphenol. Particularly preferred is phenol, m-cresol, p-cresol, 2,3-xylenol, 2,5-xylenol, 3,4-xylenol, 3,5-xylenol, or 2,3,5-trimethylphenol. Two or more of these phenols may be used in combination. In view of solubility in alkaline developing solutions, m-cresol is preferred, and a combination of m-cresol and p-cresol is also preferred. Specifically, the novolac resin (a) preferably includes a cresol novolac resin having m-cresol residues or having m-cresol residues and p-cresol residues. In this case, the molar ratio of m-cresol residues to p-cresol residues (m-cresol residues/p-cresol residues (m/p)) in the cresol novolac resin is preferably 1.8 or more. In this range, the resin can have suitable solubility in alkaline developing solutions and achieve good sensitivity. The molar ratio is more preferably 4 or more.

Preferred examples of the aldehydes above include formalin, paraformaldehyde, acetaldehyde, benzaldehyde, hydroxybenzaldehyde, and chloroacetaldehyde. Above all, formalin is particularly preferred. Two or more of these aldehydes may be used in combination. The aldehydes are preferably used in an amount of 0.6 mol or more, more preferably 0.7 mol or more, preferably 3 mol or less, more preferably 1.5 mol or less, based on 1 mol of the phenols.

The polycondensation reaction between phenols and aldehydes is generally performed using an acid catalyst. Examples of such an acid catalyst include hydrochloric acid, nitric acid, sulfuric acid, formic acid, oxalic acid, acetic acid, and p-toluenesulfonic acid. The acid catalyst is generally used in an amount of $1 \times 10^{-5}$ to $5 \times 10^{-1}$ mol, based on 1 mol of the phenols. The polycondensation reaction is generally performed using water as a reaction medium. When the reaction system is heterogeneous from the initial stage, however, a hydrophilic solvent or a lipophilic solvent may be used as the reaction medium. Examples of hydrophilic solvents include alcohols such as methanol, ethanol, propanol, butanol, and propylene glycol monomethyl ether; and cyclic ethers such as tetrahydrofuran and dioxane. Examples of lipophilic solvents include ketones such as methyl ethyl ketone, methyl isobutyl ketone and 2-heptanone. The reaction medium is generally used in an amount of 20 to 1,000 parts by weight, based on 100 parts by weight of the reactants.

The polycondensation reaction temperature is generally from 10 to 200° C., while it may be appropriately controlled depending on the reactivity of the materials. The polycondensation reaction may be performed by any appropriate method such as a method that includes introducing phenols, aldehydes, an acid catalyst, and so on at a time and allowing them to react, or a method that includes gradually adding phenols, aldehydes and so on to the reaction system in the presence of an acid catalyst as the reaction proceeds. After the polycondensation reaction is completed, the temperature of the reaction system is generally raised to 130 to 230° C. in order to remove the unreacted materials, the acid catalyst, the reaction medium, and so on from the system, and the volatile components are removed under reduced pressure so that the novolac resin can be collected.

In an embodiment of the invention, the novolac resin (a) preferably has a polystyrene-equivalent weight average molecular weight (hereinafter referred to as "Mw") of 1,000 or more, preferably 2,000 or more, preferably 20,000 or less, more preferably 10,000 or less. In this range, the positive-type photosensitive resin composition of the invention can have high solubility in alkaline developing solutions and can provide good workability in the process of applying it to a substrate.

The polymer (b) comprising, as a main component, the structure represented by formula (1) and/or the structure represented by formula (2) can be converted into a polymer having an imide ring, an oxazole ring or any other cyclic structure by heating or using an appropriate catalyst. The polymer (b) is preferably a polyimide precursor such as polyamic acid or polyamic acid ester, or a polybenzoxazole precursor such as polyhydroxyamide. The formation of the cyclic structure dramatically improves the heat resistance or the solvent resistance. The composition may contain a combination of two or more of these resins. As used herein, the term "main component" means that the n structural units of the structure represented by formula (1) and/or the n structural units of the structure represented by formula (2) make up 50% by mole or more of the structural units of the polymer. The n structural units preferably make up 70% by mole or more, more preferably 90% by mole of more of the structural units of the polymer.

[Formula 2]

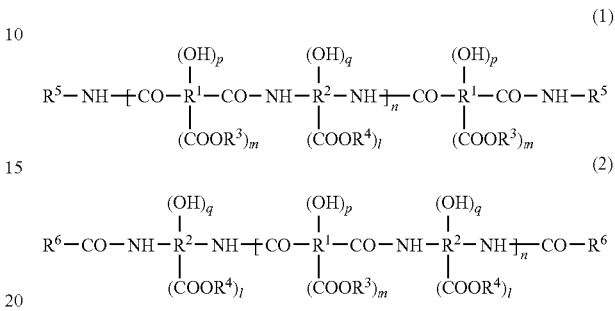

In formulae (1) and (2), the $R^1$ may be the same or different and each represent an organic group having two or more carbon atoms and a valence of 2 to 8, which may correspond to a structural component of an acid. Examples of an acid that may form the $R^1$ with a valence of 2 include aromatic dicarboxylic acids such as terephthalic acid, isophthalic acid, diphenyletherdicarboxylic acid, naphthalenedicarboxylic acid, and bis(carboxyphenyl)propane; and aliphatic dicarboxylic acids such as cyclohexanedicarboxylic acid and adipic acid. Examples of an acid that may form the $R^1$ with a valence of 3 include tricarboxylic acids such as trimellitic acid and trimesic acid. Examples of an acid that may form the $R^1$ with a valence of 4 include tetracarboxylic acids such as pyromellitic acid, benzophenonetetracarboxylic acid, biphenyltetracarboxylic acid, diphenylethertetracarboxylic acid, and diphenylsulfonetetracarboxylic acid, diester compounds produced by modifying two carboxyl groups thereof with methyl or ethyl groups, aliphatic tetracarboxylic acids such as butanetetracarboxylic acid and cyclopentanetetracarboxylic acid, and diester compounds produced by modifying two carboxyl groups thereof with methyl or ethyl groups. Examples thereof also include hydroxyl group-containing acids such as hydroxyphthalic acid and hydroxytrimellitic acid. One or more of these acid components may be used alone or in any combination. It is preferred that tetracarboxylic acid should make up 1 to 40% by mole of the acid components. In view of solubility in alkaline developing solutions or photosensitivity, a hydroxyl group-containing acid component(s) should preferably make up at least 50% by mole, more preferably at least 70% by mole of the acid components used.

In view of heat resistance, the $R^1$ preferably has an aromatic ring and is more preferably an organic group having 6 to 30 carbon atoms and a valence of 3 or 4. More specifically, $R^1(COOR^3)_m(OH)_p$ in formulae (1) and (2) preferably has a structure represented by formula (6):

[Formula 3]

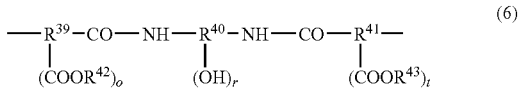

In formula (6), $R^{39}$ and $R^{41}$ each represent an organic group having 2 to 20 carbon atoms and a valence of 2 to 4, $R^{40}$ represents an organic group having 3 to 20 carbon atoms and a valence of 3 to 6, $R^{42}$ and $R^{43}$ may be the same or different and each represent hydrogen or a monovalent organic group of 1 to 20 carbon atoms, o and t each represent an integer of 0 to 2, and r represents an integer of 1 to 4, provided that o+t≦2.

In view of the heat resistance of the resulting polymer, the $R^{39}$ and $R^{41}$ each preferably have an aromatic ring, and examples of particularly preferred structures thereof include trimellitic acid, trimesic acid, and naphthalenetricarboxylic acid residues.

$R^{40}$ represents an organic group having 3 to 20 carbon atoms and a valence of 3 to 6. In addition, the r hydroxyl groups are preferably at locations adjacent to the amide bond. For example, such a structure may be bonded to the amino group of a fluorine atom-containing compound such as bis(3-amino-4-hydroxyphenyl)hexafluoropropane or bis(3-hydroxy-4-aminophenyl)hexafluoropropane or the amino group of a fluorine atom-free compound such as bis(3-amino-4-hydroxyphenyl)propane, bis(3-hydroxy-4-aminophenyl)propane, 3,3'-diamino-4,4'-dihydroxybiphenyl, 3,3'-dihydroxy-4,4'-diaminobiphenyl, 2,4-diamino-phenol, 2,5-diaminophenol, or 1,4-diamino-2,5-dihydroxybenzene.

In formula (6), $R^{42}$ and $R^{43}$ may be the same or different and each represent hydrogen or a monovalent organic group of 1 to 20 carbon atoms, each preferably represent hydrogen or a hydrocarbon group of 1 to 20 carbon atoms. When the number of the carbon atoms is 20 or less, suitable solubility in alkaline developing solutions can be provided. The letters o and t each represent an integer of 0 to 2, preferably 1 or 2, provided that o+t≦2. The letter r represents an integer of 1 to 4. In this range, good patterning property can be provided.

Preferred examples of the structure represented by formula (6) include, but are not limited to, the following structures:

[Formula 4]

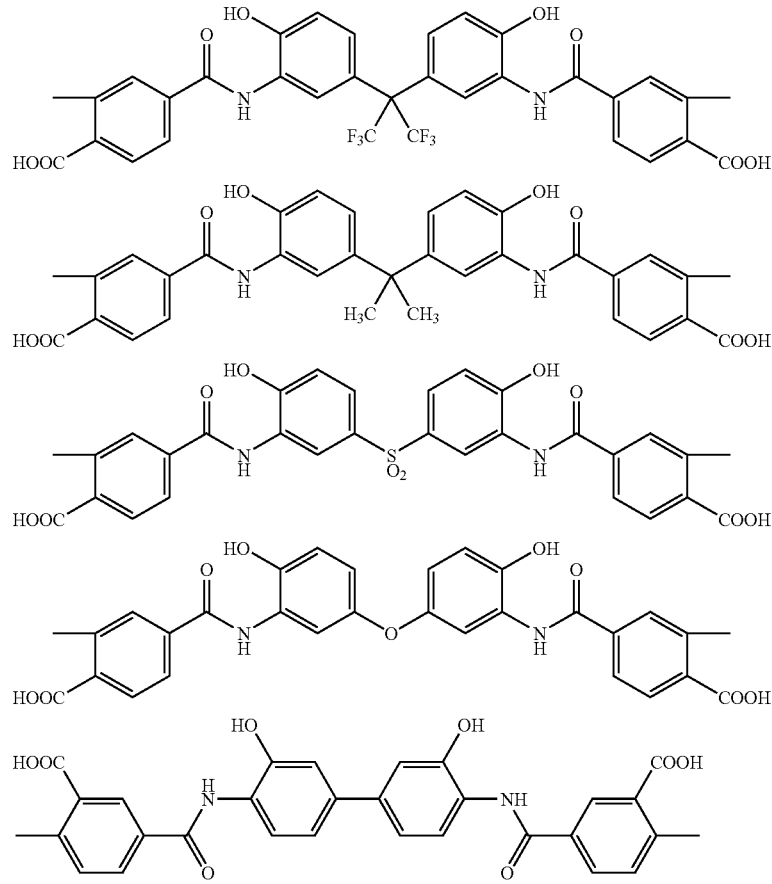

[Formula 5]

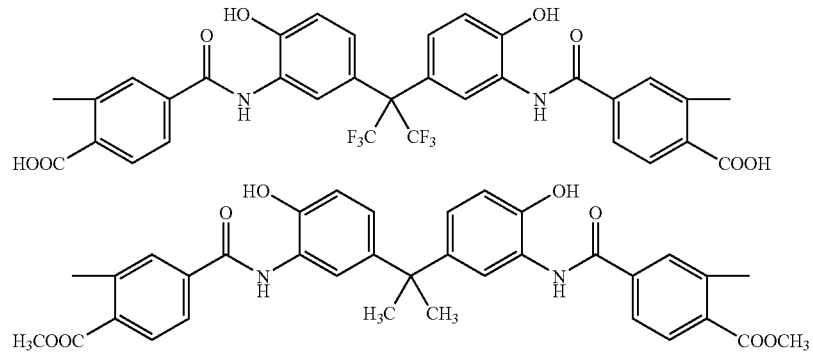

-continued

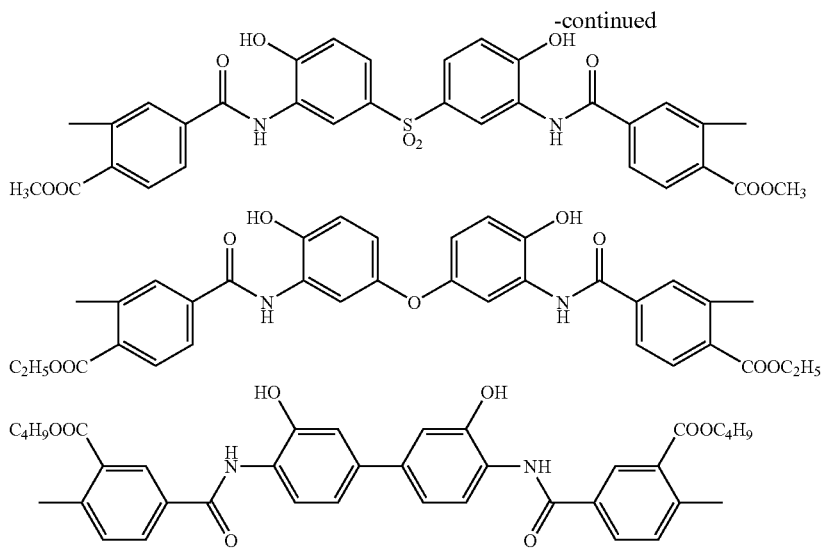

In formulae (1) and (2), the $R^2$ may be the same or different and each represent an organic group having two or more carbon atoms and a valence of 2 to 8, which may correspond to a structural component of a diamine. Among them, in view of the heat resistance of the resulting polymer, the $R^2$ preferably has an aromatic ring. A diamine component or two or more diamine components may be used alone or in combination. Examples of the diamine include fluorine atom-containing diamines such as bis(amino-hydroxy-phenyl)hexafluoropropane and bis(trifluoromethyl)benzidine, fluorine atom-free diamines such as phenylenediamine, diaminodiphenyl ether, aminophenoxybenzene, diaminodiphenylmethane, diaminodiphenylsulfone, bis(aminophenoxyphenyl)propane, and bis(aminophenoxyphenyl)sulfone, compounds derived therefrom and having an alkyl group or a halogen atom as a substituent on the aromatic ring, diaminodihydroxypyrimidine, diaminodihydroxypyridine, hydroxy-diamino-pyrimidine, diaminophenol, dihydroxybenzidine, diaminobenzoic acid, diaminoterephthalic acid, aliphatic diamines such as cyclohexyldiamine, methylenebiscyclohexylamine and hexamethylenediamine, and diamine compounds each having a structure represented by any one of formulae (7), (8) and (9), which corresponds to $R^2(COOR^4)_l(OH)_q$ in formulae (1) and (2). In particular, the hydroxyl group-containing diamine component(s) preferably makes up at least 60% by mole of the diamine components used, in view of solubility in alkaline developing solutions or photosensitivity.

[Formula 6]

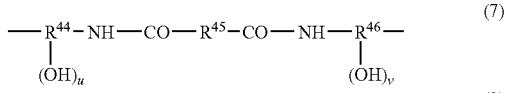 (7)

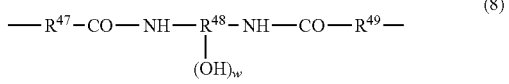 (8)

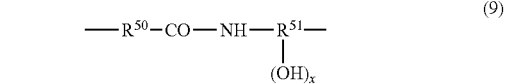 (9)

In formula (7), $R^{44}$ and $R^{46}$ each represent an organic group having 2 to 20 carbon atoms and a valence of 3 to 4, $R^{45}$ represents a divalent organic group of 2 to 30 carbon atoms, and u and v each represent 1 or 2. In formula (8), $R^{47}$ and $R^{49}$ each represent a divalent organic group of 2 to 20 carbon atoms, $R^{48}$ represents an organic group having 3 to 20 carbon atoms and a valence of 3 to 6, and w represents an integer of 1 to 4. In formula (9), $R^{50}$ represents a divalent organic group of 2 to 20 carbon atoms, $R^{51}$ represents an organic group having 3 to 20 carbon atoms and a valence of 3 to 6, and x represents an integer of 1 to 4.

In formula (7), $R^{44}$ and $R^{46}$ each represent an organic group having 2 to 20 carbon atoms and a valence of 3 to 4. In view of the heat resistance of the resulting polymer, the $R^{44}$ or $R^{46}$ preferably has an aromatic ring. Examples of —$R^{44}(OH)_u$— and $R^{46}(OH)_v$— include hydroxyphenyl, dihydroxyphenyl, hydroxynaphthyl, dihydroxynaphthyl, hydroxybiphenyl, dihydroxybiphenyl, bis(hydroxyphenyl)hexafluoropropane, bis(hydroxyphenyl)propane, bis(hydroxyphenyl)sulfone, hydroxydiphenyl ether, and dihydroxydiphenyl ether. An aliphatic group such as hydroxycyclohexyl or dihydroxycyclohexyl may also be used. $R^{45}$ represents a divalent organic group of 2 to 30 carbon atoms, which preferably has an aromatic ring in view of the heat resistance of the resulting polymer. Examples of such a group include phenyl, biphenyl, diphenyl ether, diphenylhexafluoropropane, diphenylpropane, and diphenylsulfone. Besides the above, an aliphatic group such as cyclohexyl may also be used.

In formula (8), $R^{47}$ and $R^{49}$ each represent a divalent organic group of 2 to 20 carbon atoms, which preferably has an aromatic ring in view of the heat resistance of the resulting polymer. Examples of such a group include those listed above for $R^{45}$. $R^{48}$ represents an organic group having 3 to 20 carbon atoms and a valence of 3 to 6, which preferably has an aromatic ring in view of the heat resistance of the resulting polymer. Examples of —$R^{48}(OH)_w$— include those listed above for —$R^{44}(OH)_u$— and —$R^{46}(OH)_v$—.

In formula (9), $R^{50}$ represents a divalent organic group of 2 to 20 carbon atoms, which preferably has an aromatic ring in view of the heat resistance of the resulting polymer. Examples of such a group include those listed above for $R^{45}$. $R^{51}$ represents an organic group having 3 to 20 carbon atoms and a valence of 3 to 6, which preferably has an aromatic ring in view of the heat resistance of the resulting polymer. Examples of $-R^{51}(OH)_x-$ include those listed above for $-R^{44}(OH)_u-$ and $-R^{46}(OH)_v-$.

Preferred examples of the structure represented by formula (7) include, but are not limited to, the following structures:

[Formula 7]

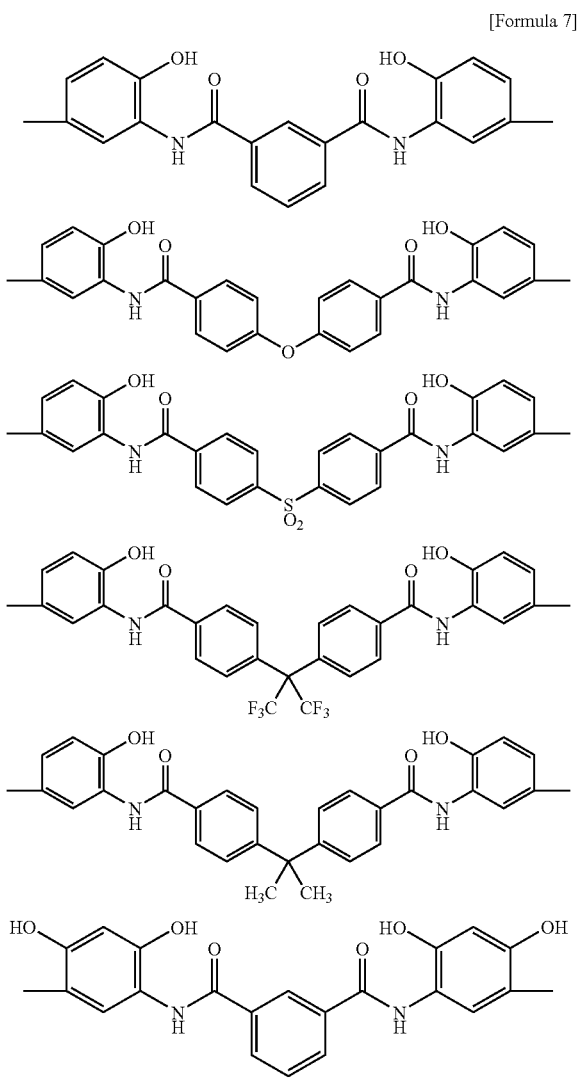

Preferred examples of the structure represented by formula (8) include, but are not limited to, the following structures:

[Formula 8]

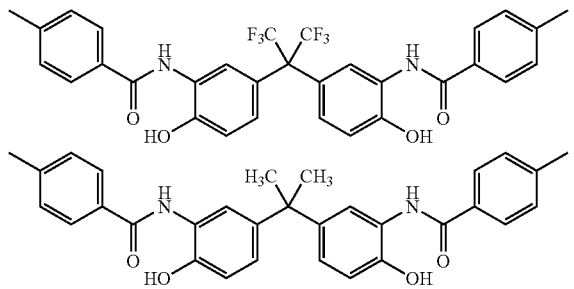

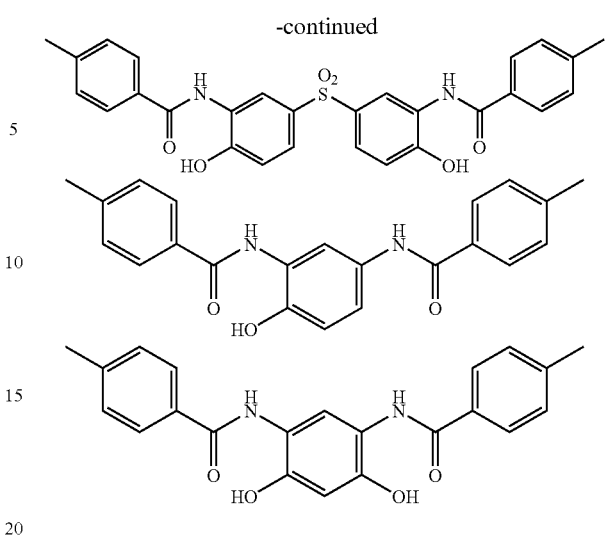

Preferred examples of the structure represented by formula (9) include, but are not limited to, the following structures:

[Formula 9]

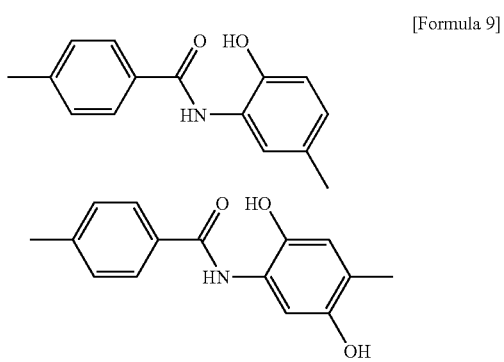

In formulae (1) and (2), $R^3$ and $R^4$ may be the same or different and each represent hydrogen or a monovalent organic group of 1 to 20 carbon atoms. In view of the stability of the resulting solution of the photosensitive resin composition, $R^3$ and $R^4$ are each preferably an organic group, but in view of solubility in alkaline developing solutions, $R^3$ and $R^4$ are each preferably hydrogen. In an embodiment of the invention, hydrogen and the organic group may be present together. If the contents of the hydrogen and the organic group represented by $R^3$ and $R^4$ are controlled, the dissolution rate in alkaline developing solutions will be changed. Therefore, the control makes it possible to produce a photosensitive resin composition having a suitable dissolution rate. In a preferred range, the hydrogen atom should make up 10 to 90% by mole of each of the $R^3$ and $R^4$ moieties. In view of solubility in alkaline developing solutions, the organic group should have 20 or less carbon atoms. Therefore, the moieties represented by $R^3$ and $R^4$ preferably include at least one hydrocarbon group of 1 to 16 carbon atoms and hydrogen atoms as the remainder moieties.

In formulae (1) and (2), l and m each represent the number of the carboxyl groups or the ester groups, which is an integer of 0 to 2, preferably 1 or 2. In formulae (1) and (2), p and q each represent an integer of 0 to 4, provided that p+q>0. In formulae (1) and (2), n represents the number of the repeating structural units of the polymer, which is in the range of 10 to 100,000. If n is less than 10, the solubility of the polymer in alkaline developing solutions may be too high so that no contrast may be obtained between the exposed and unexposed portions, which may make it impossible to form the desired pattern. If n is more than 100,000, the solubility of the polymer in alkaline developing solutions may be too low so that the exposed portion may be insoluble, which makes it impossible to form the desired pattern. In view of the solubility of the polymer in alkaline developing solutions, n is preferably 1,000 or less, more preferably 100 or less. In view of improvement the elongation, n is preferably 20 or more.

The number n in formulae (1) and (2) is easily calculated from the weight average molecular weight (Mw) which may be measured by gel permeation chromatography (GPC), light-scattering method, small angle X-ray scattering technique, or the like. The number n is Mw/M (n=Mw/M), wherein M is the molecular weight of the repeating unit, and Mw is the weight average molecular weight of the polymer. In an embodiment of the invention, the number n of the repeating units may refer to a value calculated using polystyrene-equivalent GPC measurement, which is most convenient.

In order to improve the adhesion to substrates, a siloxane structure-containing aliphatic group may be used as the $R^1$ and/or the $R^2$ in formulae (1) and (2), as long as it does not reduce the heat resistance. Specifically, 1 to 10% by mole of a diamine component such as bis(3-aminopropyl)tetramethyldisiloxane or bis(p-amino-phenyl)octamethylpentasiloxane may be copolymerized.

In formulae (1) and (2), —NH—$R^5$ and —CO—$R^6$ each represent a polymer end group. In the case of formula (1), a monoamino compound may be used at the end. In the case of formula (2), a monoacid anhydride, a monocarboxylic acid, a monoacid chloride compound, or a mono-active ester compound may be used at the end. $R^5$ and $R^6$ each represent a monovalent organic group having 2 to 30 carbon atoms which includes an unsaturated hydrocarbon group. $R^5$ and $R^6$ each preferably has an aromatic ring in view of the heat resistance of the resulting polymer. The unsaturated hydrocarbon group in the $R^5$ and $R^6$ can react to form a crosslinked structure during curing by heat so that good mechanical properties can be provided. Since novolac resin, which corresponds to the component (a), is relatively brittle, known conventional compositions containing novolac resin, a quinone diazide compound and a polyimide precursor or a polybenzoxazole precursor have the problem of insufficient mechanical properties after heat curing. Therefore, satisfactory mechanical properties have not been obtained in permanent film applications such as protective films for semiconductor devices. In the positive-type photosensitive resin composition of the invention, the polymer as the component (b) has the end group as described above. Therefore, as the crosslinking reaction is allowed to proceed by heat treatment, the resin composition of the invention can be thermally cured to have dramatically improved mechanical properties, even though it contains novolac resin.

Examples of the $R^5$ and $R^6$ include o-vinylphenyl, m-vinylphenyl, p-vinylphenyl, o-ethynylphenyl, m-ethynylphenyl, p-ethynylphenyl, o-propynylphenyl, m-propynylphenyl, p-propynylphenyl, o-allylphenyl, m-allylphenyl, p-allylphenyl, o-(3-hydroxy-3-methyl-1-butynyl)phenyl, m-(3-hydroxy-3-methyl-1-butynyl)phenyl, p-(3-hydroxy-3-methyl-1-butynyl)phenyl, o-(3-hydroxy-3-methyl-1-pentynyl)phenyl, m-(3-hydroxy-3-methyl-1-pentynyl)phenyl, p-(3-hydroxy-3-methyl-1-pentynyl)phenyl, o-(3-hydroxy-3-ethyl-1-pentynyl)phenyl, m-(3-hydroxy-3-ethyl-1-pentynyl)phenyl, p-(3-hydroxy-3-ethyl-1-pentynyl)phenyl, o-nitrophenyl, m-nitrophenyl, p-nitrophenyl, o-methylolphenyl, m-methylolphenyl, p-methylolphenyl, o-methylbenzoate, m-methylbenzoate, and p-methylbenzoate. Examples of the aromatic ring-free group include 3-vinylcyclohexyl, 4-vinylcyclohexyl, 3-ethynylcyclohexyl, 4-ethynylcyclohexyl, 3-propynylcyclohexyl, and 4-propynylcyclohexyl. More preferred are m-vinylphenyl, p-vinylphenyl, m-ethynylphenyl, p-ethynylphenyl, m-propynylphenyl, p-propynylphenyl, m-allylphenyl, p-allylphenyl, m-(3-hydroxy-3-methyl-1-pentynyl)phenyl, and p-(3-hydroxy-3-methyl-1-pentynyl)phenyl. In view of heat resistance, an unsaturated triple bond-containing group such as m-ethynylphenyl, p-ethynylphenyl, m-propynylphenyl, p-propynylphenyl, m-(3-hydroxy-3-methyl-1-pentynyl)phenyl, or p-(3-hydroxy-3-methyl-1-pentynyl)phenyl is more preferred. The $R^5$ and $R^6$ may each have two or more unsaturated bonds.

The polymer end group is preferably introduced in an amount of 0.1 to 40% by mole, particularly preferably 1 to 30% by mole, based on the amount of the diamine component(s).

The end group introduced into the polymer is easily detected by the methods described below. For example, the resin having the introduced end component may be dissolved in an acid solution and decomposed into resin component units such as an amine component and an acid anhydride component, and the components may be measured by gas chromatography (GC) or NMR so that the end group can be easily detected. Alternatively, the resin having the introduced end component may be directly measured by pyrolysis gas chromatography (PGC), infrared spectroscopy, and $^{13}C$ NMR spectroscopy so that the end group can be detected.

The polymer comprising, as a main component, the structure represented by formula (1) and/or the structure represented by formula (2) may be synthesized by the methods described below. For example, when the polymer is polyamic acid or polyamic acid ester, it may be synthesized by a method that includes performing, at low temperature, the reaction of a tetracarboxylic acid dianhydride, a diamine compound, and a monoamino compound used for end capping, a method that includes producing a diester from a tetracarboxylic acid dianhydride and an alcohol and then allowing the diester to react with a diamine compound and a monoamino compound in the presence of a condensing agent, or a method that includes producing a diester from a tetracarboxylic acid dianhydride and an alcohol, then converting the remaining dicarboxylic acid into an acid chloride, and allowing them to react with a diamine compound and a monoamino compound. When the polymer is polyhydroxyamide, it may be synthesized by a method that includes polycondensing a bisaminophenol compound, a dicarboxylic acid and a monoamino compound. Specifically, such a method may include allowing a dehydrating condensation agent such as dicyclohexylcarbodiimide (DCC) to react with an acid and then adding a bisaminophenol compound and a monoamino compound thereto or include adding a tertiary amine such as pyridine to a solution of a bisaminophenol compound and a monoamino compound and then adding a dicarboxylic acid dichloride solution dropwise to the solution.

In a preferred mode, after the materials are polymerized by the method described above, the product is added to a large amount of water or a mixture of methanol/water or the like, and the resulting precipitate is separated by filtration and dried so that the polymer comprising, as a main component, the structure represented by formula (1) and/or the structure represented by formula (2) can be isolated. The separation process makes it possible to remove the unreacted monomers and oligomer components such as dimers and trimers, which improves the properties of the thermally cured film.

The amount of the polymer comprising, as a main component, the structure represented by formula (1) and/or the structure represented by formula (2) is preferably 30 parts by weight or more, more preferably 40 parts by weight or more, based on 100 parts by weight of the novolac resin (a). The amount in this range allows a further improvement in the mechanical properties after heat curing. In order to improve the sensitivity, the amount is preferably 100 parts by weight or less, more preferably 80 parts by weight or less.

The positive-type photosensitive resin composition of the invention contains a quinone diazide compound (c). The composition of the invention may contain two or more types of quinone diazide compounds. Examples of the quinone diazide compound include polyhydroxy compound derivatives having an ester-bonded quinone diazide sulfonic acid part, polyamino compound derivatives having a sulfonamide-bonded quinone diazide sulfonic acid part, and polyhydroxy-polyamino compound derivatives having an ester-bonded quinone diazide sulfonic acid part and/or a sulfonamide-bonded quinone diazide sulfonic acid part. For example, the quinone diazide compound may be produced by allowing 5-naphthoquinone diazide sulfonyl chloride to react with a polyhydroxy compound in the presence of triethylamine. Not all the functional groups of the polyhydroxy compound or the polyamino compound have to be substituted with quinone diazide. In view of the contrast between the exposed and unexposed portions, 50% by mole or more of all the functional groups are preferably substituted with quinone diazide. The use of the quinone diazide compound makes it possible to produce a positive-type photosensitive resin composition sensitive to general ultraviolet rays such as i-line (365 nm), h-line (405 nm), and g-line (436 nm) rays from mercury lamps.

Examples of the polyhydroxy compound include, but are not limited to, Bis-Z, BisP-EZ, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, and HML-TPHAP (trade names, manufactured by Honshu Chemical Industry Co., Ltd.); BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, and TM-BIP-A (trade names, manufactured by Asahi Organic Chemicals Industry Co., Ltd.); 2,6-dimethoxymethyl-4-tert-butylphenol, 2,6-dimethoxymethyl-p-cresol, 2,6-diacetoxymethyl-p-cresol, naphthol, tetrahydroxybenzophenone, methyl gallate, bisphenol A, bisphenol E, methylene bisphenol, and BisP-AP (trade name, manufactured by Honshu Chemical Industry Co., Ltd.).

Examples of the polyamino compound include, but are not limited to, 1,4-phenylenediamine, 1,3-phenylenediamine, 4,4'-diaminodiphenyl ether, 4,4'-diaminodiphenylmethane, 4,4'-diaminodiphenylsulfone, and 4,4'-diaminodiphenyl sulfide.

Examples of the polyhydroxy-polyamino compound include, but are not limited to, 2,2-bis(3-amino-4-hydroxyphenyl)hexafluoropropane and 3,3'-dihydroxybenzidine.

In an embodiment of the invention, 5-naphthoquinone diazide sulfonyl group and 4-naphthoquinone diazide sulfonyl group are both preferably used for the quinone diazide. Some 4-naphthoquinone diazide sulfonyl ester compounds that show absorption in the mercury lamp i-line region are suitable for i-line exposure. Some 5-naphthoquinone diazide sulfonyl ester compounds that show absorption up to the mercury lamp g-line region are suitable for g-line exposure.

In an embodiment of the invention, 4-naphthoquinone diazide sulfonyl ester compounds or 5-naphthoquinone diazide sulfonyl ester compounds are preferably selected depending on the exposure wavelength. A naphthoquinone diazide sulfonyl ester compound having both 4-naphthoquinone diazide sulfonyl and 5-naphthoquinone diazide sulfonyl groups in a single molecule is also available, and a 4-naphthoquinone diazide sulfonyl ester compound may be used in combination with a 5-naphthoquinone diazide sulfonyl ester compound.

The molecular weight of the quinone diazide compound is preferably 2,500 or less, more preferably 1,500 or less, even more preferably 1,200 or less. The quinone diazide compound with a molecular weight of 2,500 or less can be sufficiently decomposed by heat in heat treatment after pattern forming, so that a cured film having a high level of heat resistance and adhesion properties can be obtained. On the other hand, the molecular weight is preferably 300 or more, more preferably 350 or more.

In an embodiment of the invention, the composition preferably contains a naphthoquinone diazide compound represented by formula (3). Positive-type photosensitive resin compositions that contain a novolac resin and a polyimide precursor or a polybenzoxazole precursor like the positive-type photosensitive resin composition of the invention should be heat-treated so that the polyimide precursor or the polybenzoxazole precursor can be cured through a ring-closing reaction by heating. Particularly in such applications as surface protective films for semiconductor devices and interlayer dielectric films, cured films are generally treated at a high temperature of 180 to 290° C. in a post process. In order to prevent gas formation in the post treatment process, therefore, the resin compositions are often cured by heat treatment at a temperature higher than that in the post treatment process, namely at a temperature of 300° C. or higher. When a certain pattern formed using a positive-type photosensitive resin containing the novolac resin (a) and the polymer (b) comprising, as a main component, the structure represented by formula (1) and/or the structure represented by formula (2) is heat-treated at a high temperature of 300° C. or higher, it is generally deformed because the novolac resin has a low softening point. According to the invention, the naphthoquinone diazide compound represented by formula (3) may be used, so that pattern deformation can be prevented even when the resin composition containing novolac resin is subjected to heat treatment at 300° C. or higher.

[Formula 10]

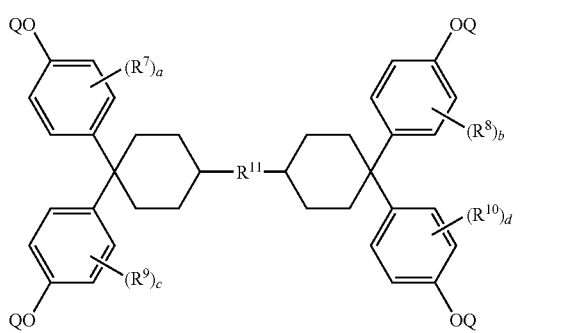

(3)

In formula (3), $R^7$ to $R^{10}$ may be the same or different and each represent hydrogen or a monovalent organic group of 1 to 10 carbon atoms. Examples of the organic group include a hydrocarbon group such as alkyl of 1 to 10 carbon atoms and alkenyl and an alkoxy group of 1 to 10 carbon atoms. The alkyl group is preferably an alkyl group of 1 to 4 carbon atoms, such as methyl, ethyl, butyl, propyl, n-butyl, isobutyl, sec-butyl, or tert-butyl. The alkoxy group is preferably an alkoxy group of 1 to 4 carbon atoms, such as methoxy, ethoxy, hydroxyethoxy, propoxy, hydroxypropoxy, isopropoxy, isobutoxy, n-butoxy, sec-butoxy, or tert-butoxy. The alkenyl group is preferably an alkenyl group of 2 to 4 carbon atoms, such as vinyl, propenyl, allyl, or butenyl. $R^{11}$ represents a divalent organic group, which is preferably a hydrocarbon group of 1 to 30 carbon atoms.

In formula (3), Q represents a 5-naphthoquinone diazide sulfonyl group, a 4-naphthoquinone diazide sulfonyl group or hydrogen, provided that not all Q moieties are hydrogen. In an embodiment of the invention, the molar ratio of the naphthoquinone diazide sulfonyl group represented by Q to the hydrogen atoms represented by Q (naphthoquinone diazide sulfonyl group/hydrogen) is preferably 3/5 or more, which leads to good pattern profile. The molar ratio is preferably 3 or less, more preferably 5/3 or less, which leads to an improvement in patterning property. As used herein, the term "naphthoquinone diazide sulfonyl group" refers to the total of 5-naphthoquinone diazide sulfonyl and 4-naphthoquinone diazide sulfonyl groups.

The quinone diazide compound represented by formula (3) preferably has a molecular weight of 2,500 or less, more preferably 1,600 or less and preferably has a molecular weight of 800 or more, more preferably 900 or more.

The naphthoquinone diazide compound represented by formula (3) may be produced by esterification between the corresponding polyhydroxy compound and naphthoquinone diazide sulfonic acid. For example, the polyhydroxy compound may be synthesized according to the method described in JP-A No. 49-250, which includes allowing an α-(hydroxyphenyl)styrene derivative to react with a polyphenol compound in the presence of an acid catalyst. Examples of polyhydroxy compounds that are preferably used in an embodiment of the invention include the compounds shown below. Two or more of these polyhydroxy compounds may be used in combination.

[Formula 11]

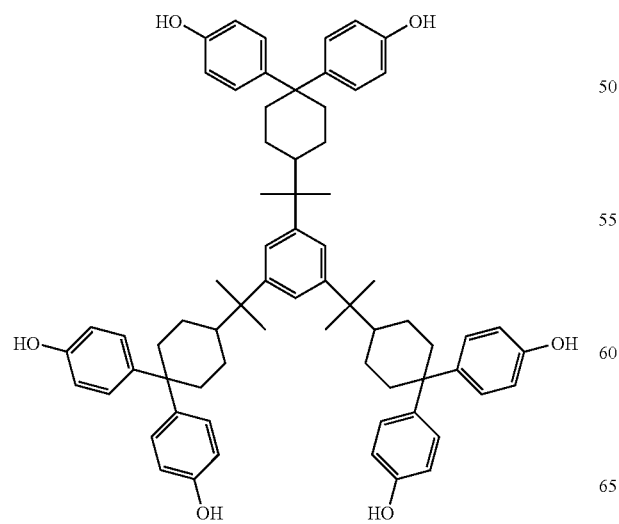

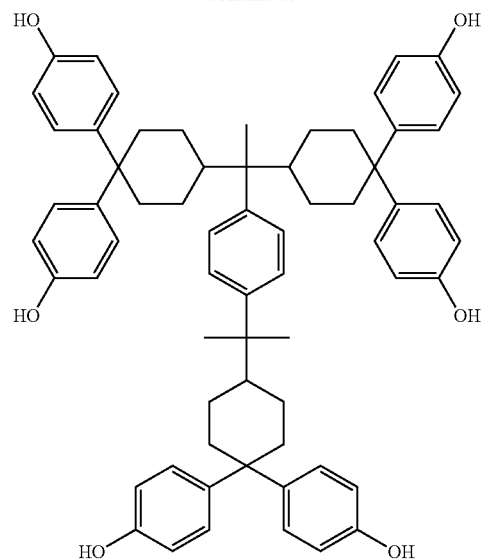

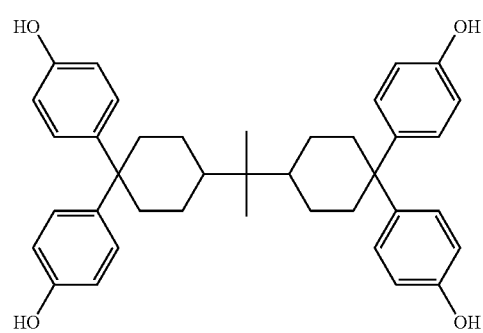

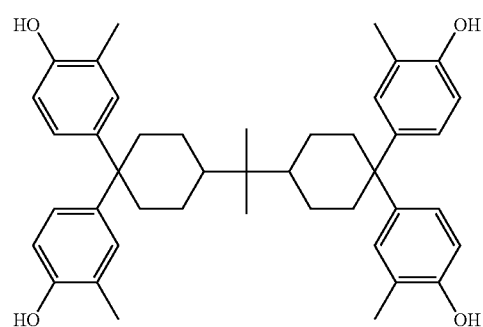

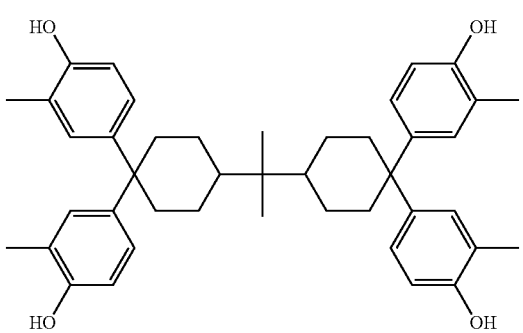

-continued

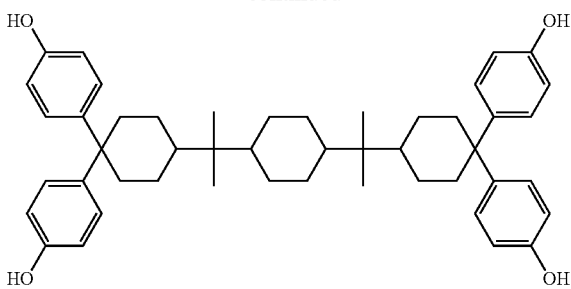

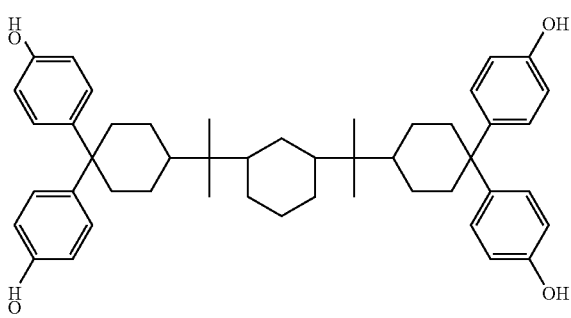

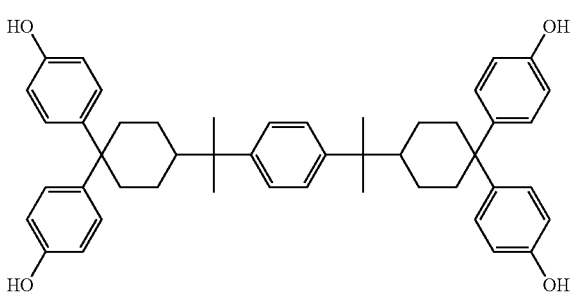

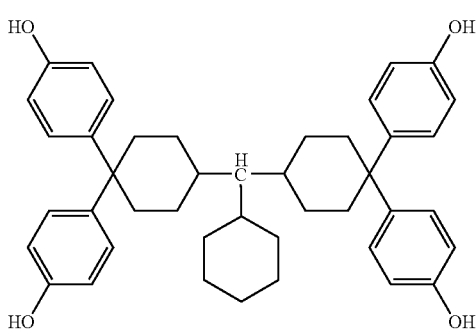

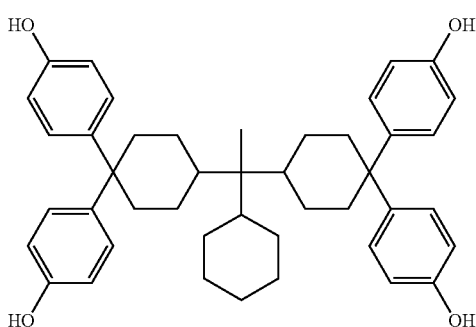

-continued

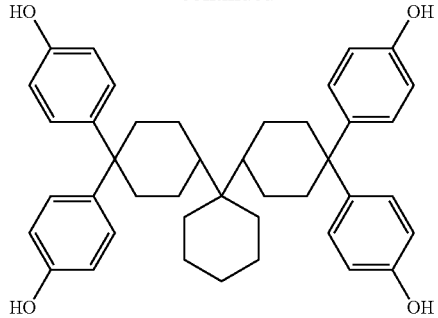

For example, the naphthoquinone diazide compound represented by formula (3) may be produced by performing a general esterification reaction of part or all of the hydroxyl groups of the polyhydroxy compound with 1,2-naphthoquinonediazide-5-(and/or -4-)sulfonyl chloride in the presence of a basic catalyst. Specifically, given amounts of the polyhydroxy compound, 1,2-naphthoquinonediazide-5-(and/or -4-)sulfonyl chloride and a solvent are charged into a flask, and they are subjected to a condensation reaction, while a basic catalyst is added dropwise thereto. For example, the solvent may be dioxane, acetone, methyl ethyl ketone, N-methylpyrrolidone, or the like. For example, the basic catalyst may be sodium hydroxide, sodium hydrogen carbonate, triethylamine, or the like. The reaction temperature is generally from −20° C. to 60° C., preferably from 0° C. to 40° C. The resulting product is generally washed with water, then purified and dried.

In the esterification reaction, a mixture of products different in the number and position of the ester groups is obtained. As used herein, the "esterification degree" (the molar ratio of the naphthoquinone diazide sulfonyl groups represented by Q to the hydrogen atoms represented by Q) is defined as the average value with respect to the mixture. The esterification degree as defined above may be controlled by the mixing ratio between the raw materials, the polyhydroxy compound and 1,2-naphthoquinonediazide-5-(and/or -4-)sulfonyl chloride. Since 1,2-naphthoquinonediazide-5-(and/or -4-)sulfonyl chloride added causes substantially all esterification reactions, the molar ratio between the raw materials should be controlled so that a mixture with the desired esterification degree can be obtained. Specifically, based on 1 mol of the polyhydroxy compound, the quinone diazide compound is preferably 1.5 mol or more and preferably 3 mol or less, more preferably 2.5 mol or less.

The amount of the quinone diazide compound (c) is preferably 1 parts by weight or more, more preferably 3 parts by weight or more, preferably 50 parts by weight or less, more preferably 40 parts by weight or less, based on 100 parts by weight of the total amount of the novolac resin (a) and the polymer component (b).

The positive-type photosensitive resin composition of the invention contains an alkoxymethyl group-containing compound (d). The alkoxymethyl group can cause a crosslinking reaction in a temperature region of 150° C. or higher. Therefore, the compound contained in the composition can be added to the ortho-position with respect to the phenolic hydroxyl group of the novolac resin (a) or the polymer (b) comprising, as a main component, the structure represented by formula (1) or (2) so that a crosslinked structure can be formed, when the polyimide precursor or the polybenzoxazole precursor is cured by heat treatment through a ring-closing reaction by heating. This process achieves good mechanical properties. If the component (d) is absent, the cured film can be too brittle to be self-supporting, because the novolac resin is brittle. The component (d) is preferably a compound having two or more alkoxymethyl groups, in order to increase the crosslinking density. In order to further increase the crosslinking density and the mechanical properties, the compound preferably has four or more alkoxymethyl groups. In an embodiment of the invention, the alkoxymethyl group-containing compound is preferably a compound having a group represented by formula (4) or a compound represented by formula (5). These compounds may be used in combination.

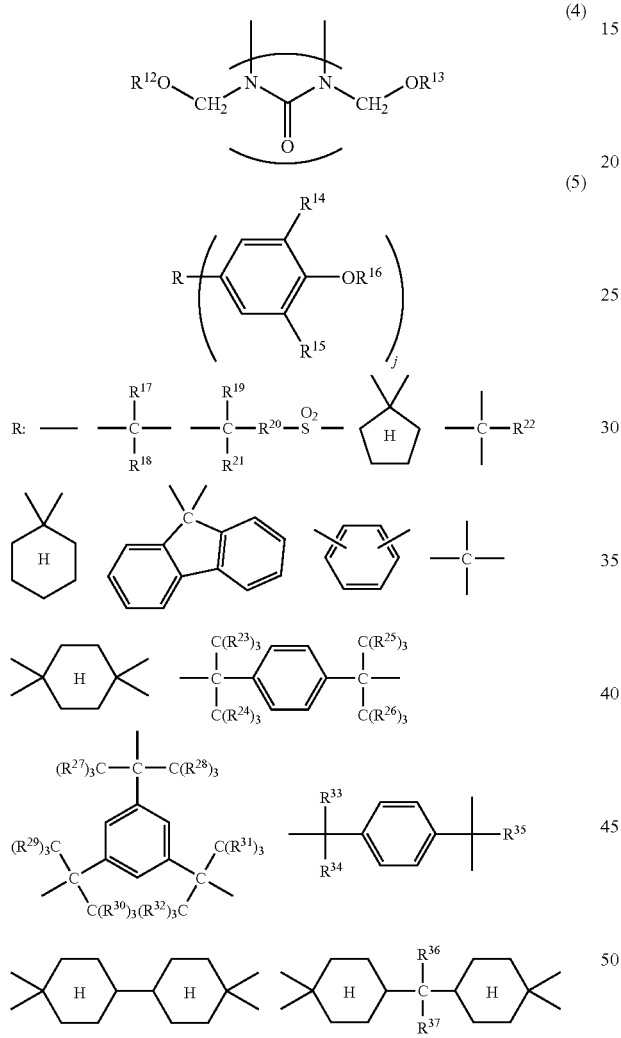

In formula (4), $R^{12}$ and $R^{13}$ each represent an alkyl group of 1 to 20 carbon atoms, which is preferably an alkyl group of 1 to 10 carbon atoms, more preferably an alkyl group of 1 to 3 carbon atoms, in view of the solubility with the resin composition.

In formula (5), $R^{14}$ and $R^{15}$ each represent $CH_2OR^{38}$, wherein $R^{38}$ represents an alkyl group of 1 to 6 carbon atoms, which is preferably an alkyl group of 1 to 3 carbon atoms in view of compatibility with other components. $R^{16}$ represents a hydrogen atom, a methyl group or an ethyl group. $R^{17}$ to $R^{37}$ may be the same or different and each represent a hydrogen atom, a monovalent organic group of 1 to 20 carbon atoms, Cl, Br, I, or F, and j represents an integer of 1 to 4.

Examples of the compound having the group represented by formula (4) include, but not limited to, the following compounds:

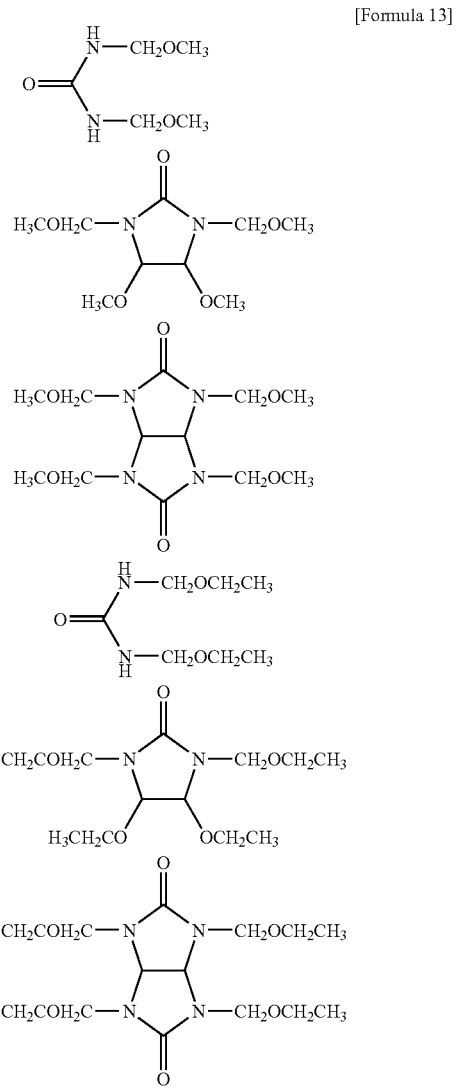

Examples of the compound represented by formula (5) include, but are not limited to, the following compounds:

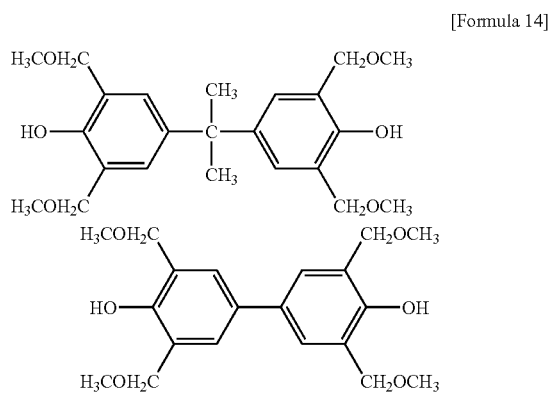

-continued

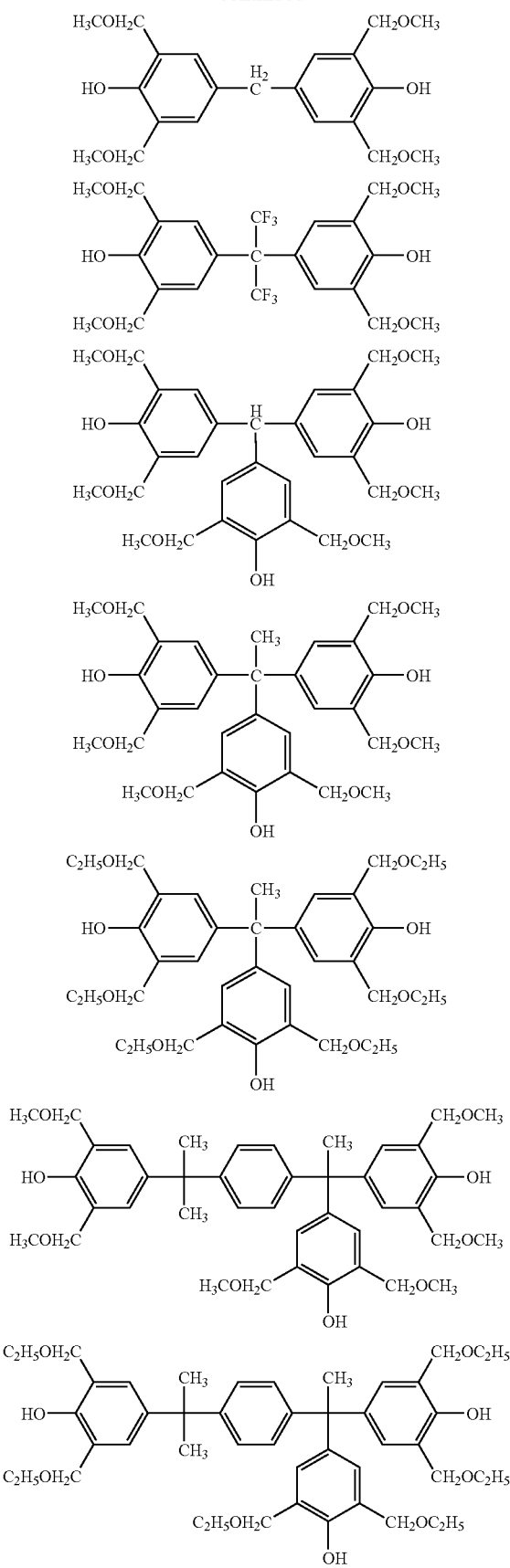

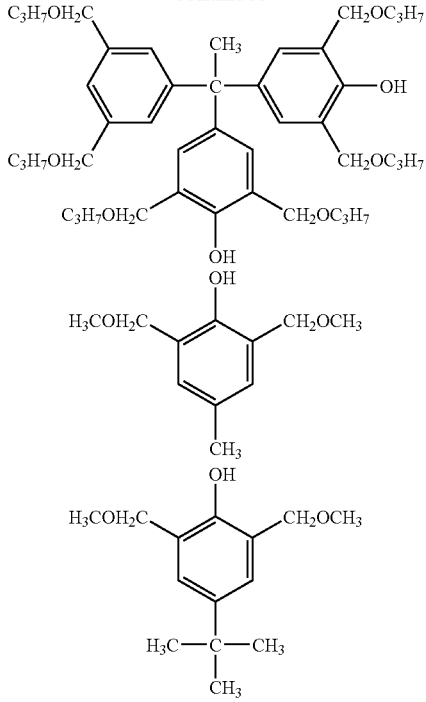

In view of mechanical properties, the amount of the alkoxymethyl group-containing compound (d) is preferably 5 parts by weight or more, more preferably 10 parts by weight or more, based on 100 parts by weight of the total amount of the novolac resin (a) and the polymer component (b). In view of mechanical properties, the amount of the alkoxymethyl group-containing compound (d) is preferably 50 parts by weight or less, more preferably 40 parts by weight or less, even more preferably 30 parts by weight or less.

The positive-type photosensitive resin composition of the invention contains a solvent (e). Examples of the solvent include polar aprotic solvents such as N-methyl-2-pyrrolidone, γ-butyrolactone, N,N-dimethylformamide, N,N-dimethylacetamide, and dimethylsulfoxide; ethers such as tetrahydrofuran, dioxane, and propylene glycol monomethyl ether; ketones such as acetone, methyl ethyl ketone, diisobutyl ketone, and diacetone alcohol; esters such as ethyl acetate, propylene glycol monomethyl ether acetate, and ethyl lactate; and aromatic hydrocarbons such as toluene and xylene. The composition of the invention may contain two or more of these solvents. The amount of the solvent is preferably 50 parts by weight or more, more preferably 100 parts by weight or more, preferably 2,000 parts by weight or less, more preferably 1,500 parts by weight or less, based on 100 parts by weight of the total amount of the novolac resin (a) and the polymer component (b).

The positive-type photosensitive resin composition of the invention may contain (f) a silane compound. The silane compound (f) contained in the composition can improve the adhesion to the underlying substrate. Examples of the silane compound (f) include, but are not limited to, N-phenylaminoethyltrimethoxysilane, N-phenylaminoethyltriethoxysilane, N-phenylaminopropyltrimethoxysilane, N-phenylaminopropyltriethoxysilane, N-phenylaminobutyltrimethoxysilane, N-phenylaminobutyltriethoxysilane, vinyltrimethoxysilane, vinyltriethoxysilane, vinyltrichlorosilane, vinyltris(β-methoxyethoxy)silane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, and the following silane compounds.

[Formula 15]

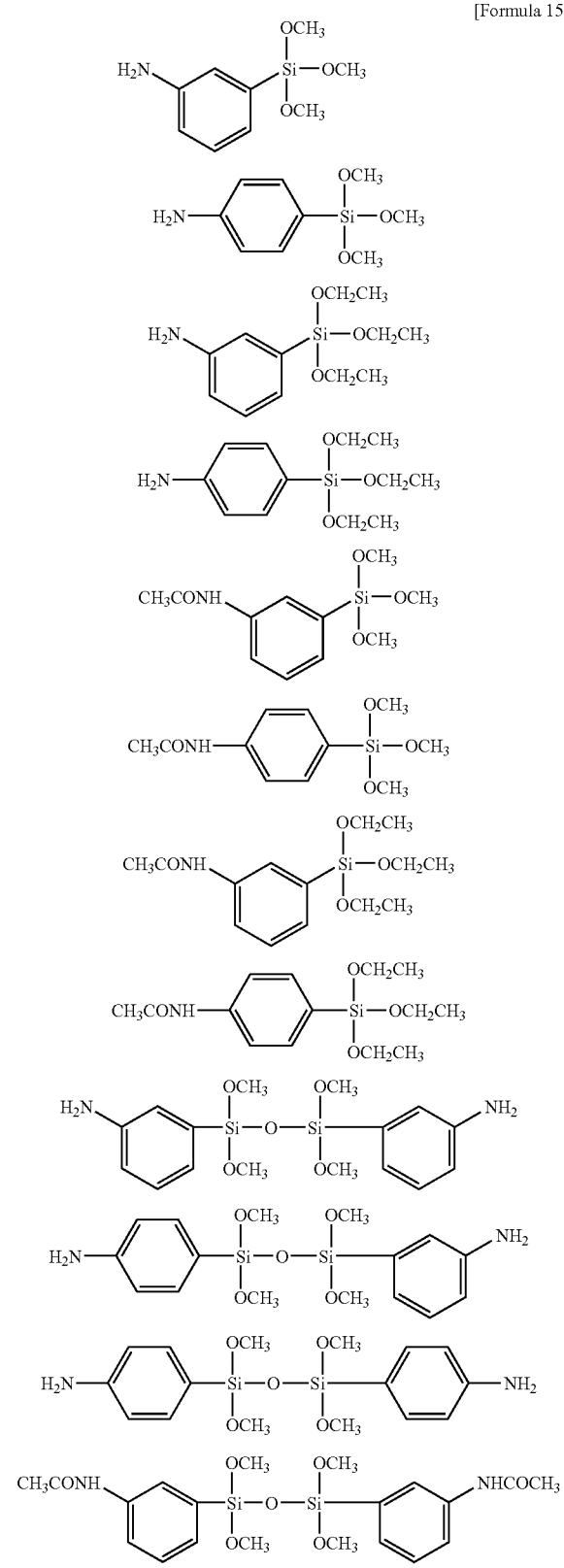

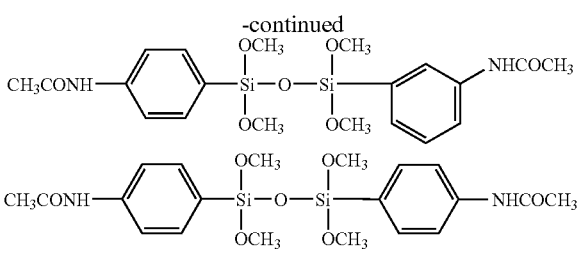

Based on 100 parts by weight of the total amount of the novolac resin (a) and the polymer component (b), the amount of the silane compound (f) is preferably 0.001 parts by weight or more, more preferably 0.005 parts by weight or more, even more preferably 0.01 parts by weight or more, preferably 30 parts by weight or less, more preferably 20 parts by weight or less, even more preferably 15 parts by weight or less. In this range, the silane compound can be sufficiently effective as an adhesion aid, while the heat resistance of the positive-type photosensitive resin composition is maintained.

If necessary, the positive-type photosensitive resin composition of the invention may also contain a phenolic hydroxyl group-containing compound. The resulting positive-type photosensitive resin composition containing the phenolic hydroxyl group-containing compound has improved sensitivity. Therefore, the resulting composition is hardly soluble in alkaline developing solutions before exposure but becomes easily soluble in alkaline developing solutions upon exposure so that development can be readily performed without degrading the film. Examples of particularly preferred phenolic hydroxyl group-containing compounds include Bis-Z, TekP-4HBPA, TrisP-HAP, TrisP-PA, BisRS-2P, and BisRS-3P (trade names, manufactured by Honshu Chemical Industry Co., Ltd.), and BIR-PC, BIR-PTBP, and BIR-BIPC-F (trade names, manufactured by Asahi Organic Chemicals Industry Co., Ltd.).

Based on 100 parts by weight of the total amount of the novolac resin (a) and the polymer component (b), the amount of the phenolic hydroxyl group-containing compound is preferably 1 part by weight or more, more preferably 3 parts by weight or more, preferably 50 parts by weight or less, more preferably 40 parts by weight or less. In the present invention, even when having a phenolic hydroxyl group, quinone diazide moiety-containing compounds are classified as the quinone diazide compounds (c).

For the purpose of improving wettability between the composition and a substrate, if necessary, the composition may also contain a surfactant, esters such as ethyl lactate and propylene glycol monomethyl ether acetate, alcohols such as ethanol, ketones such as cyclohexanone and methyl isobutyl ketone, or ethers such as tetrahydrofuran and dioxane. The composition may also contain particles of an inorganic material such as silicon dioxide or titanium dioxide or polyimide powders.

Examples of methods for preparing the positive-type photosensitive resin composition of the invention include methods that includes adding the components (a) to (e) and other optional components to a glass flask or a stainless steel vessel and stirring them with a mechanical stirrer or the like to form a solution, methods of applying an ultrasonic wave to the components to form a solution, and methods of stirring the components in a planetary mixing/defoaming machine to form a solution. The viscosity of the composition is preferably from 1 to 10,000 mPa·s. The composition may also be filtered through a filter with a pore size of 0.1 μm to 5 μm so that foreign substances can be removed.

Next, a description is given of methods for forming a heat-resistant resin pattern by using the positive-type photosensitive resin composition of the invention.

The photosensitive resin composition is applied to a substrate. A silicon wafer, ceramics, gallium arsenide, metal, glass, a metal oxide insulating film, silicon nitride, ITO, or the like may be used (but not limited to) for the substrate. The method of application may be spin coating with a spinner, spray coating, roll coating, slit die coating, or the like. The composition is generally applied so that the coating film can have a thickness of 0.1 to 150 μm after drying, while the thickness depends on the method of application, the solids content of the composition, the viscosity of the composition, or the like.

The photosensitive resin composition coated on the substrate is then dried to form a photosensitive resin film. The drying is preferably performed at a temperature in the range of 50° C. to 150° C. for 1 minute to several hours with an oven, a hot plate, infrared rays, or the like.

Actinic rays are then applied to the photosensitive resin film through a mask having the desired pattern in an exposure process. Examples of actinic rays used in the exposure process include ultraviolet rays, visible rays, electron beams, and X rays. In an embodiment of the invention, i-line (365 nm), h-line (405 nm), or g-line (436 nm) light from a mercury lamp is preferably used.

After the exposure, the exposed portion may be removed using a developing solution so that a patterned heat-resistant resin film can be produced from the photosensitive resin film. The developing solution is preferably an aqueous solution of tetramethylammonium, an aqueous solution of an compound which shows alkaline property such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine. In some cases, one or few of polar solvents such as N-methyl-2-pyrrolidone, N,N-dimethylformamide, N,N-dimethylacetamide, dimethylsulfoxide, γ-butyrolactone, and dimethylacrylamide, alcohols such as methanol, ethanol, and isopropanol, esters such as ethyl lactate and propylene glycol monomethyl ether acetate, and ketones such as cyclopentanone, cyclohexanone, isobutyl ketone, and methyl isobutyl ketone may be added singly or in combination to the aqueous solution of the compound. The development may be followed by rinsing with water. In the rinsing process, alcohols such as ethanol and isopropyl alcohol or esters such as ethyl lactate and propylene glycol monomethyl ether acetate may be added to water.

After the development, the film is converted into a heat-resistant resin film by applying a temperature of 200° C. to 500° C. The heat treatment may be performed for 5 minutes to 5 hours, in which the temperature may be selected and gradually raised, or a certain temperature range may be selected, and the temperature may be continuously raised. For example, heat treatment may be performed at each of 130° C., 200° C. and 350° C. for 30 minutes. An alternative method includes linearly raising the temperature from room temperature to 320° C. over 2 hours.

The heat-resistant resin film produced using the positive-type photosensitive resin composition of the invention is suitable for use in applications such as passivation films for semiconductor devices, protective films for semiconductor devices, interlayer dielectric films for multilayer interconnections for high density packaging, and insulating layers for organic electro-luminescent devises.

EXAMPLES

The invention is further described by the examples below, which are not intended to limit the scope of the invention. The photosensitive resin composition obtained in each example was evaluated by the methods described below.

(1) Evaluation of Patterning Property

Preparation of Photosensitive Resin Film

The photosensitive resin composition (hereinafter referred to as "varnish") was applied to a 6-inch silicon wafer so that the coating film could have a thickness T1 of 8.0 μm after prebaking. The coating was then prebaked using a hot plate (a coating and developing system Mark-7 manufactured by Tokyo Electron Limited) at 120° C. for 3 minutes so that a photosensitive resin film was obtained.

Method for Measuring Film Thickness

Lambda Ace STM-602 manufactured by Dainippon Screen Mfg. Co., Ltd. was used. The thickness of the film after the prebaking and that after the development were measured at a refractive index of 1.629, and that of the cured film was measured at a refractive index of 1.773.

Exposure

A patterned reticle was placed in an exposure system (i-line stepper DSW-8570i manufactured by GCA Corporation). The photosensitive resin film was exposed to i-line light at the intensity of 365 nm for different exposure times.

Development

In the developing system Mark-7 manufactured by Tokyo Electron Limited, an aqueous 2.38% tetramethylammonium hydroxide solution was sprayed on the exposed film at 50 rpm for 10 seconds. The film was then allowed to stand at 0 rpm for 30 seconds, rinsed with water at 400 rpm and dried by centrifugation at 3,000 rpm for 10 seconds.

Calculation of Sensitivity

After the exposure and development, the exposure time Eop1 for which a 50 μm 1:1 line and space pattern (1L/1S) was formed (hereinafter referred to as "optimal exposure time") was determined. Cases where the Eop1 was 400 mJ/cm$^2$ or less were determined to have good patterning property. More preferred is 200 mJ/cm$^2$ or less.

(2) Evaluation of Storage Stability

After the varnish was stored under a yellow lamp at 23° C. for 14 days, a coating film was prepared from the varnish at the same rotation number as in the evaluation section (1), and the thickness T2 of the coating film was measured. Subsequently, the film was subjected to the exposure and the development, and the optimal exposure time Eop2 was determined. The value of T1-T2 was calculated. Cases where the absolute value of T1-T2 was 0.3 μm or less were evaluated as good, while cases where it was more than 0.3 μm were evaluated as poor. The value of Eop2-Eop1 was also calculated. Cases where the absolute value of Eop2-Eop1 was 50 mJ/cm$^2$ or less were evaluated as good, while cases where it was more than 50 mJ/cm$^2$ were evaluated as poor.

(3) Evaluation of Mechanical Properties

Preparation of Heat-Resistant Resin Film

The varnish was applied to a 6-inch silicon wafer so that the coating film could have a thickness of 13 μm after prebaking. The coating was then prebaked using a hot plate (a coating and developing system Mark-7 manufactured by Tokyo Electron Limited) at 120° C. for 3 minutes so that a photosensitive resin precursor film was obtained. The film was then developed by the method described in the section (1), and the resulting photosensitive resin precursor film was heat-treated under nitrogen flow (at an oxygen concentration of 20 ppm or less) with Inert Oven INH-21CD manufactured by Koyo Thermo System Co., Ltd. in which the film was heated at 150°

C. for 30 minutes, then raised the temperature to 320° C. over 1 hour and heated at 320° C. for 30 minutes so that a heat-resistant resin film (cured film) was prepared.

Preparation of Measurement Sample

The cured film prepared on the silicon wafer was immersed in 47% hydrofluoric acid at room temperature for 7 minutes, then washed with water, and carefully separated from the silicon wafer. The separated cured film was cut into 1 cm-wide, about 9 cm-long strips with a single edged knife, and the strips were used as measurement samples.

Measurement

Each measurement sample was attached to Tensilon RTM-100 manufactured by Orientec Co., Ltd., and the initial sample length was set to 50 mm. The tensile test was performed on the sample at a tension rate of 50 mm/minute. The measurement was performed on 12 samples (n=12), and the averages of the resulting top five maximum stresses, elastic moduli, and elongations were determined, respectively.

(4) Evaluation of Pattern Profile Characteristics after Heat Curing

Heat Curing

The film was developed by the method described in the section (1), and the resulting photosensitive resin precursor film was heat-treated under nitrogen flow (at an oxygen concentration of 20 ppm or less) with Inert Oven CLH-21CD manufactured by Koyo Thermo System Co., Ltd. in which the film was placed in the oven at 150° C., immediately raised the temperature to 320° C. over 30 minutes and heat-treated at 320° C. for 30 minutes so that a heat-resistant resin film (cured film) was prepared.

Evaluation of Pattern Profile

After the heat curing, the cross-section of the patterned film was observed using FE-SEM manufactured by Hitachi High-Technologies Corporation. According to the evaluation criteria, rectangle or almost rectangle cross-sections were evaluated as acceptable, while almost round cross-sections with no sharp edge were evaluated as unacceptable. FIG. 1 shows the criteria for the evaluation of the pattern profile characteristics after the heat curing, in which A is excellent, B is good and acceptable, and C is unacceptable.

Synthesis Example 1

Synthesis of Hydroxyl-Group Containing Acid Anhydride (a)

Under dry nitrogen flow, 18.3 g (0.05 mol) of 2,2-bis(3-amino-4-hydroxyphenyl)hexafluoropropane (BAHF) and 34.2 g (0.3 mol) of allyl glycidyl ether were dissolved in 100 g of gamma-butyrolactone (GBL), and the mixture was cooled to −15° C. A solution of 22.1 g (0.11 mol) of trimellitic anhydride chloride in 50 g of GBL was added dropwise to the mixture in such a manner that the temperature of the reaction liquid did not exceed 0° C. After the addition was completed, the mixture was allowed to react at 0° C. for 4 hours. The resulting solution was concentrated using a rotary evaporator. The concentrate was added to 1 L of toluene so that a hydroxyl group-containing acid anhydride (a) represented by the formula below was obtained.

[Formula 16]

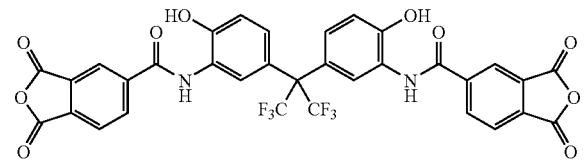

Hydroxyl Group-Containing Acid Anhydride (a)

Synthesis Example 2

Synthesis of Hydroxyl Group-Containing Diamine Compound (b)

A solution of 18.3 g (0.05 mol) of BAHF in 100 mL of acetone and 17.4 g (0.3 mol) of propylene oxide was cooled to −15° C. A solution of 20.4 g (0.11 mol) of 3-nitrobenzoyl chloride in 100 mL of acetone was added dropwise thereto. After the addition was completed, the mixture was allowed to react at −15° C. for 4 hours and then returned to room temperature. The precipitated white solid was separated by filtration and dried under vacuum at 50° C.

Thirty g of the solid was added to a 300 mL stainless steel autoclave and dispersed in 250 mL of methyl cellosolve, and 2 g of 5% palladium-carbon was added thereto. Hydrogen was introduced thereto from a balloon so that a reduction reaction was performed at room temperature. After about 2 hours, it was confirmed that the balloon could not deflate any more, and the reaction was completed. After the reaction, the palladium compound catalyst was removed by filtration, and the filtrate was concentrated using a rotary evaporator so that a hydroxyl group-containing diamine compound (b) represented by the formula below was obtained.

[Formula 17]

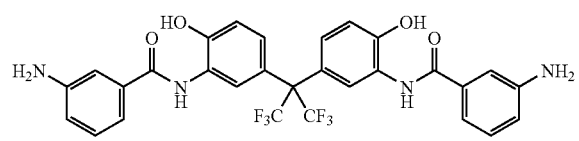

Hydroxyl Group-Containing Diamine (b)

Synthesis Example 3

Synthesis of Hydroxyl Group-Containing Diamine (c)

A solution of 15.4 g (0.1 mol) of 2-amino-4-nitrophenol in 50 mL of acetone and 30 g (0.34 mol) of propylene oxide was cooled to −15° C. A solution of 11.2 g (0.055 mol) of isophthaloyl chloride in 60 mL of acetone was added dropwise thereto. After the addition was completed, the mixture was allowed to react at −15° C. for 4 hours. The product was then returned to room temperature, and the resulting precipitate was collected by filtration.

The precipitate was dissolved in 200 mL of GBL, and 3 g of 5% palladium-carbon was added thereto and vigorously stirred. A balloon filled with hydrogen gas was attached thereto, and the mixture was continuously stirred at room temperature until the hydrogen gas balloon did not deflate any more. The mixture was further stirred for 2 hours with the hydrogen gas balloon remaining attached. After the stirring was completed, the palladium compound was removed by filtration, and the solution was concentrated to half volume using a rotary evaporator. Ethanol was added to the concentrate, and recrystallization was performed so that crystals of a hydroxyl group-containing diamine (c) represented by the formula below was obtained.

[Formula 18]

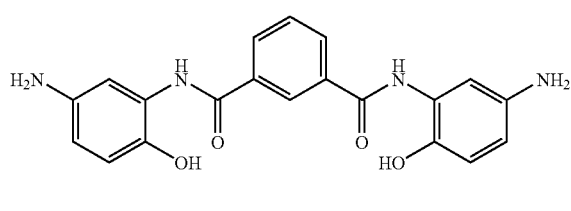

Hydroxyl Group-Containing Diamine (c)

Synthesis Example 4

Synthesis of Hydroxyl Group-Containing Diamine (d)

A solution of 15.4 g (0.1 mol) of 2-amino-4-nitrophenol in 100 mL of acetone and 17.4 g (0.3 mol) of propylene oxide was cooled to −15° C. A solution of 20.4 g (0.11 mol) of 4-nitrobenzoyl chloride in 100 mL of acetone was gradually added dropwise thereto. After the addition was completed, the mixture was allowed to react at −15° C. for 4 hours. The product was then returned to room temperature, and the resulting precipitate was collected by filtration. The precipitate was then subjected to the same process as in Synthesis Example 2 so that crystals of a hydroxyl group-containing diamine (d) represented by the formula below was obtained.

[Formula 19]

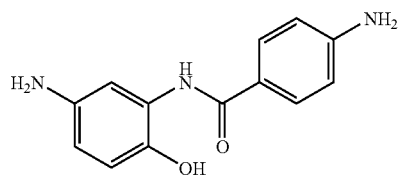

Hydroxyl Group-Containing Diamine (d)

Synthesis Example 5

Synthesis of Quinone Diazide Compound (e)

Under dry nitrogen flow, 15.31 g (0.05 mol) of TrisP-HAP (trade name, manufactured by Honshu Chemical Industry Co., Ltd.) and 40.28 g (0.15 mol) of 5-naphthoquinone diazide sulfonyl chloride (NAC5) were dissolved in 450 g of 1,4-dioxane, and the solution was kept at room temperature. A mixture of 50 g of 1,4-dioxane and 15.18 g of triethylamine was added dropwise to the solution in such a manner that the system did not exceed 35° C. After the addition, the mixture was stirred at 30° C. for 2 hours. The triethylamine salt was separated by filtration, and the filtrate was added to water. The resulting precipitate was then collected by filtration. The precipitate was dried using a vacuum drier so that a quinone diazide compound (e) represented by the formula below was obtained.

[Formula 20]

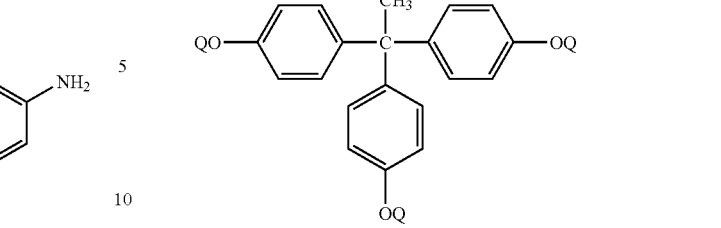

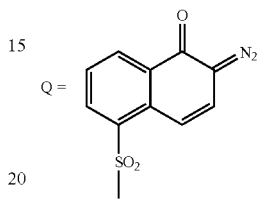

Quinone Diazide Compound (e)

Synthesis Example 6

Synthesis of Quinone Diazide Compound (f)

Under dry nitrogen flow, 21.22 g (0.05 mol) of TrisP-PA (trade name, manufactured by Honshu Chemical Industry Co., Ltd.), 26.86 g (0.10 mol) of 5-naphthoquinone diazide sulfonyl chloride and 13.43 g (0.05 mol) of 4-naphthoquinone diazide sulfonyl chloride were dissolved in 450 g of 1,4-dioxane, and the solution was kept at room temperature. The solution was then subjected to the same process as in Synthesis Example 5 with a mixture of 50 g of 1,4-dioxane and 12.65 g of triethylamine, so that a quinone diazide compound (f) represented by the formula below was obtained.

[Formula 21]

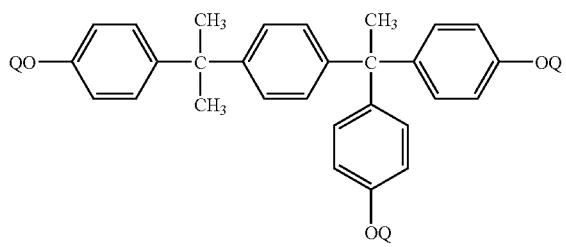

Quinone diazide compound (f)

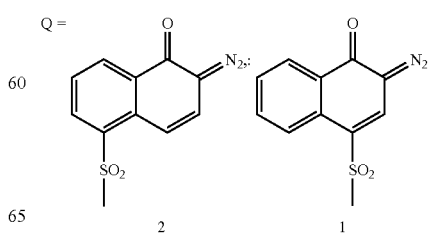

Synthesis Example 7

Synthesis of Quinone Diazide Compound (g)

To a 2 L flask were added 57.67 g (0.1 mol) of TekP-4HBPA (trade name, manufactured by Honshu Chemical Industry Co., Ltd.) and 26.87 g (0.1 mol) of NAC5. They were dissolved in 450 g of 1,4-dioxane, and the solution was kept at room temperature. A mixture of 50 g of 1,4-dioxane and 10.12 g of triethylamine was added dropwise to the solution in such a manner that the system did not exceed 35° C. After the addition, the mixture was stirred at 40° C. for 2 hours. The triethylamine salt was separated by filtration, and the filtrate was added to water. The resulting precipitate was then collected by filtration. The precipitate was dried using a vacuum drier so that a quinone diazide compound (g) was obtained.

[Formula 22]

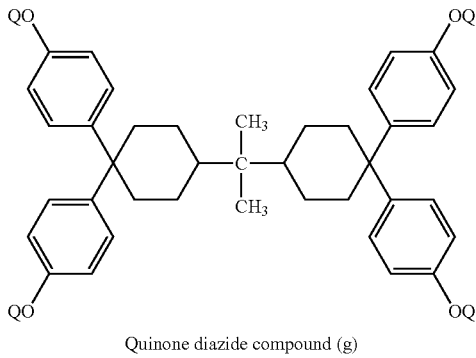

Quinone diazide compound (g)

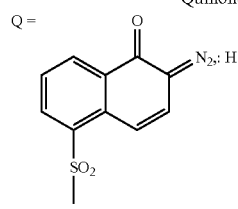

1     3

Synthesis Example 8

Synthesis of Quinone Diazide Compound (h)

To a 2 L flask were added 57.67 g (0.1 mol) of TekP-4HBPA (trade name, manufactured by Honshu Chemical Industry Co., Ltd.) and 40.30 g (0.15 mol) of NAC5. They were dissolved in 450 g of 1,4-dioxane, and the solution was kept at room temperature. A mixture of 50 g of 1,4-dioxane and 15.18 g of triethylamine was added dropwise to the solution in such a manner that the system did not exceed 35° C. After the addition, the mixture was stirred at 40° C. for 2 hours. The triethylamine salt was separated by filtration, and the filtrate was added to water. The resulting precipitate was then collected by filtration. The precipitate was dried using a vacuum drier so that a quinone diazide compound (h) was obtained.

[Formula 23]

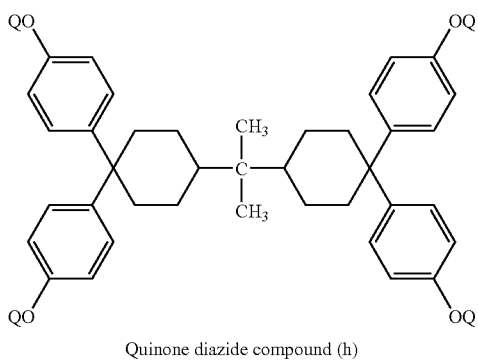

Quinone diazide compound (h)

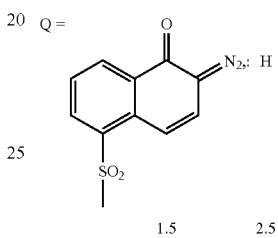

1.5     2.5

Synthesis Example 9

Synthesis of Quinone Diazide Compound (i)

To a 2 L flask were added 57.67 g (0.1 mol) of TekP-4HBPA (trade name, manufactured by Honshu Chemical Industry Co., Ltd.) and 53.74 g (0.2 mol) of NAC5. They were dissolved in 450 g of 1,4-dioxane, and the solution was kept at room temperature. A mixture of 50 g of 1,4-dioxane and 20.24 g of triethylamine was added dropwise to the solution in such a manner that the system did not exceed 35° C. After the addition, the mixture was stirred at 40° C. for 2 hours. The triethylamine salt was separated by filtration, and the filtrate was added to water. The resulting precipitate was then collected by filtration. The precipitate was dried using a vacuum drier so that a quinone diazide compound (i) was obtained.

[Formula 24]

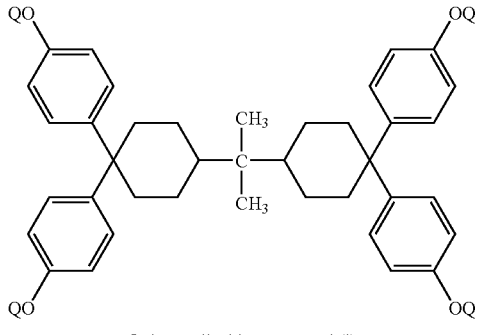

Quinone diazide compound (i)

-continued

Q = 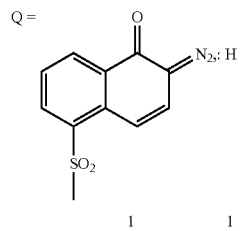

1   1

Synthesis Example 10

Synthesis of Quinone Diazide Compound (j)

To a 2 L flask were added 57.67 g (0.1 mol) of TekP-4HBPA (trade name, manufactured by Honshu Chemical Industry Co., Ltd.) and 67.17 g (0.25 mol) of NAC5. They were dissolved in 450 g of 1,4-dioxane, and the solution was kept at room temperature. A mixture of 50 g of 1,4-dioxane and 25.30 g of triethylamine was added dropwise to the solution in such a manner that the system did not exceed 35° C. After the addition, the mixture was stirred at 40° C. for 2 hours. The triethylamine salt was separated by filtration, and the filtrate was added to water. The resulting precipitate was then collected by filtration. The precipitate was dried using a vacuum drier so that a quinone diazide compound (j) was obtained.

[Formula 25]

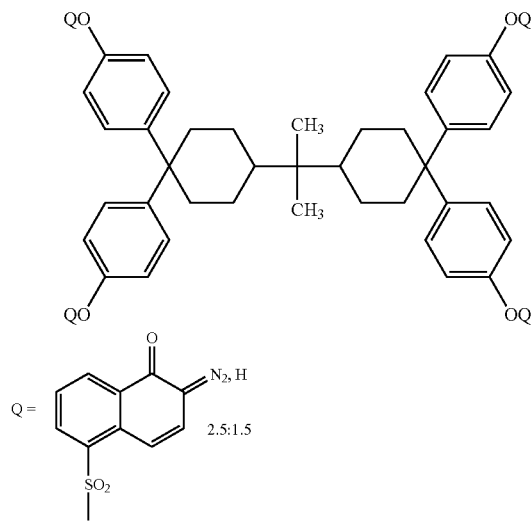

Quinone diazide compound (j)

Synthesis Example 11

Synthesis of Quinone Diazide Compound (k)

To a 2 L flask were added 57.67 g (0.1 mol) of TekP-4HBPA (trade name, manufactured by Honshu Chemical Industry Co., Ltd.) and 80.60 g (0.3 mol) of NAC5. They were dissolved in 450 g of 1,4-dioxane, and the solution was kept at room temperature. A mixture of 50 g of 1,4-dioxane and 30.36 g of triethylamine was added dropwise to the solution in such a manner that the system did not exceed 35° C. After the addition, the mixture was stirred at 40° C. for 2 hours. The triethylamine salt was separated by filtration, and the filtrate was added to water. The resulting precipitate was then collected by filtration. The precipitate was dried using a vacuum drier so that a quinone diazide compound (k) was obtained.

[Formula 26]

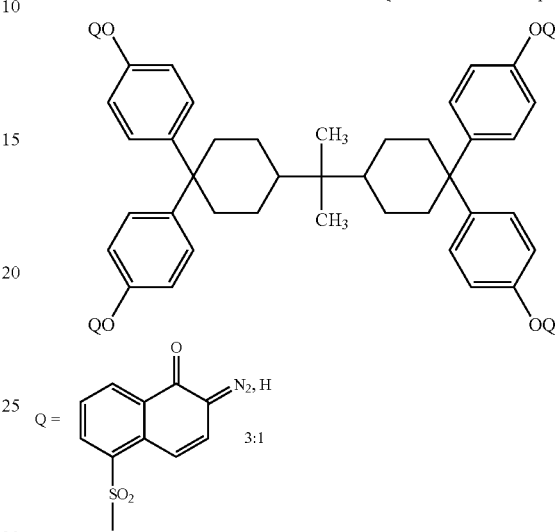

Quinone diazide compound (k)

Synthesis Example 12

Synthesis of Novolac Resin A

Under dry nitrogen flow, 70.2 g (0.65 mol) of m-cresol, 37.8 g (0.35 mol) of p-cresol, 75.5 g of an aqueous 37% by weight formaldehyde solution (0.93 mol of formaldehyde), 0.63 g (0.005 mol) of oxalic acid dihydrate, and 264 g of methyl isobutyl ketone were added to a flask, and the flask was immersed in an oil bath. While the reaction liquid was refluxed, a polycondensation reaction was performed for 4 hours. The temperature of the oil bath was then raised over 3 hours, and then the pressure in the flask was reduced to 30 to 50 mmHg so that the volatile components were removed. The dissolved resin was cooled to room temperature so that a polymer solid (named novolac resin A) was obtained. Its weight average molecular weight was 3,500 as measured by GPC.

Synthesis Example 13

Synthesis of Novolac Resin B

A polymer solid (named novolac resin B) was obtained using the process of Synthesis Example 12, except that 108 g (1.00 mol) of m-cresol was used in place of 70.2 g (0.65 mol) of m-cresol and 37.8 g (0.35 mol) of p-cresol. Its weight average molecular weight was 4,000 as measured by GPC.

Synthesis Example 14

Synthesis of Novolac Resin C

A polymer solid (named novolac resin C) was obtained using the process of Synthesis Example 12, except that 86.4 g (0.80 mol) of m-cresol and 21.6 g (0.20 mol) of p-cresol were used in place of 70.2 g (0.65 mol) of m-cresol and 37.8 g (0.35 mol) of p-cresol. Its weight average molecular weight was 5,000 as measured by GPC.

Synthesis Example 15

Synthesis of Novolac Resin D

A polymer solid (named novolac resin D) was obtained using the process of Synthesis Example 12, except that 54 g (0.50 mol) of m-cresol and 54 g (0.50 mol) of p-cresol were used in place of 70.2 g (0.65 mol) of m-cresol and 37.8 g (0.35 mol) of p-cresol. Its weight average molecular weight was 3,500 as measured by GPC.

Synthesis Example 16

Synthesis of Polymer A

Under dry nitrogen flow, 4.40 g (0.022 mol) of 4,4'-diaminophenyl ether (DAE) and 1.24 g (0.005 mol) of 1,3-bis(3-aminopropyl)tetramethyldisiloxane (SiDA) were dissolved in 50 g of N-methyl-2-pyrrolidone (NMP). To the solution were added 21.4 g (0.030 mol) of the hydroxyl group-containing acid anhydride (a) obtained in Synthesis Example 1 and 14 g of NMP, and the mixture was allowed to react at 20° C. for 1 hour and then at 40° C. for 2 hours. Thereafter, 0.71 g (0.006 mol) of 4-ethynylaniline as an end capping agent was then added thereto, and the mixture was further allowed to react at 40° C. for 1 hour. A solution prepared by diluting 7.14 g (0.06 mol) of N,N-dimethylformamide dimethyl acetal with 5 g of NMP was then added dropwise thereto over 10 minutes. After the addition, the mixture was stirred at 40° C. for 3 hours. After the reaction was completed, the solution was added to 2 L of water, and the resulting polymer solid precipitate was collected by filtration. The polymer solid was dried at 50° C. for 72 hours with a vacuum drier so that a polyimide precursor (named polymer A) was obtained.

Synthesis Example 17

Synthesis of Polymer B

Under dry nitrogen flow, 13.6 g (0.0225 mol) of the hydroxyl group-containing diamine (b) obtained in Synthesis Example 2 was dissolved in 50 g of NMP. To the solution were added 17.5 g (0.025 mol) of the hydroxyl group-containing acid anhydride (a) obtained in Synthesis Example 1 and 30 g of pyridine, and the mixture was allowed to react at 40° C. for 2 hours. Thereafter, 0.58 g (0.005 mol) of 3-ethynylaniline as an end capping agent was added thereto, and the mixture was further allowed to react at 40° C. for 1 hour. A solution prepared by diluting 7.35 g (0.05 mol) of N,N-dimethylformamide diethyl acetal with 5 g of NMP was then added dropwise thereto over 10 minutes. After the addition, the mixture was stirred at 40° C. for 2 hours. After the reaction was completed, the solution was added to 2 L of water, and the resulting polymer solid precipitate was collected by filtration. The polymer solid was dried at 80° C. for 72 hours using a vacuum drier so that a polyimide precursor (named polymer B) was obtained.

Synthesis Example 18

Synthesis of Polymer C

Under dry nitrogen flow, 15.13 g (0.040 mol) of the hydroxyl group-containing diamine compound (c) obtained in Synthesis Example 3 and 1.24 g (0.005 mol) of SiDA were dissolved in 50 g of NMP. To the solution were added 15.51 g (0.05 mol) of 3,3',4,4'-diphenylethertetracarboxylic acid anhydride (ODPA) and 21 g of NMP, and the mixture was allowed to react at 20° C. for 1 hour and then at 50° C. for 1 hour. Thereafter, 0.95 g (0.008 mol) of 4-allylaniline as an end capping agent was added thereto, and the mixture was further allowed to react at 50° C. for 1 hour. A solution prepared by diluting 13.2 g (0.09 mol) of N,N-dimethylformamide diethyl acetal with 15 g of NMP was then added dropwise thereto over 10 minutes. After the addition, the mixture was stirred at 40° C. for 3 hours. After the reaction was completed, the solution was added to 2 L of water, and the resulting polymer solid precipitate was collected by filtration. The polymer solid was dried at 80° C. for 72 hours using a vacuum drier so that a polyimide precursor (named polymer C) was obtained.

Synthesis Example 19

Synthesis of Polymer D

Under dry nitrogen flow, 6.08 g (0.025 mol) of the hydroxyl group-containing diamine compound (d) obtained in Synthesis Example 4, 4.51 g (0.0225 mol) of DAE and 0.62 g (0.0025 mol) of SiDA were dissolved in 70 g of NMP. To the solution were added 24.99 g (0.035 mol) of the hydroxyl group-containing acid anhydride (a) obtained in Synthesis Example 1, 4.41 g (0.010 mol) of 3,3',4,4'-biphenyltetracarboxylic acid dianhydride (BPDA) and 25 g of NMP at room temperature, and the mixture was stirred at room temperature for 1 hour and then at 40° C. for 1 hour. Thereafter, 1.72 g (0.010 mol) of 3-ethynylbenzenedicarboxylic acid anhydride as an end capping agent was added thereto, and the mixture was further allowed to react at 40° C. for 1 hour. A solution prepared by diluting 13.09 g (0.11 mol) of N,N-dimethylformamide dimethyl acetal with 5 g of NMP was then added dropwise thereto over 10 minutes. After the addition, the mixture was stirred at 40° C. for 3 hours. After the reaction was completed, the solution was added to 2 L of water, and the resulting polymer solid precipitate was collected by filtration. The polymer solid was dried at 80° C. for 72 hours using a vacuum drier so that a polyimide precursor (named polymer D) was obtained.

Synthesis Example 20

Synthesis of Polymer E

Under dry nitrogen flow, 18.31 g (0.050 mol) of BAHF and 19.70 g (0.040 mol) of a dicarboxylic acid derivative produced by the reaction of 1 mol of diphenylether-4,4'-dicarboxylic acid dichloride (DEDC) with 2 mol of 1-hydroxybenzotriazole were dissolved in 200 g of NMP, and the solution was stirred at 75° C. for 12 hours. A solution of 3.76 g (0.020 mol) of 3-allylbenzenedicarboxylic acid anhydride as an end capping agent in 30 g of NMP was then added thereto. The mixture was further stirred at 75° C. for 12 hours so that the reaction was completed. After the reaction, the solution was added to 3 L of a solution of water and methanol (3:1), and the resulting polymer solid precipitate was collected by filtration. The polymer solid was dried at 80° C. for 20 hours using a vacuum drier so that a polybenzoxazole precursor (named polymer E) was obtained.

Synthesis Example 21

Synthesis of Polymer F

Under dry nitrogen flow, 4.10 g (0.0205 mol) of DAE and 1.24 g (0.005 mol) of SiDA were dissolved in 50 g of NMP. To the solution were added 21.4 g (0.030 mol) of the hydroxy group-containing acid anhydride (a) obtained in Synthesis Example 1 and 14 g of NMP, and the mixture was allowed to react at 20° C. for 1 hour and then at 50° C. for 4 hours. A solution prepared by diluting 7.14 g (0.06 mol) of N,N-dimethylformamide dimethyl acetal with 5 g of NMP was then added dropwise thereto over 10 minutes. After the addition, the mixture was stirred at 50° C. for 3 hours. After the reaction was completed, the solution was added to 2 L of water, and the resulting polymer solid precipitate was collected by filtration. The polymer solid was dried at 50° C. for 72 hours using a vacuum drier so that a polyimide precursor (named polymer F) was obtained.

Synthesis Example 22

Synthesis of Polymer G

Under dry nitrogen flow, 48.1 g of DAE and 25.6 g of SiDA were dissolved in 820 g of NMP, and 105 g of ODPA was added thereto. The mixture was stirred for 8 hours, while its temperature was controlled to be in the range of 10° C. to 30° C., so that a solution of a polyimide precursor (named polymer G) was obtained.

Synthesis Example 23

Synthesis of Polymer H

Under dry nitrogen flow, 49.6 g of BAHF and 3.74 g of SiDA were dissolved in 400 g of NMP, and 46.7 g of ODPA was added thereto and stirred. The mixture was allowed to react at room temperature for 5 hours so that a solution of a polyimide precursor (named polymer H) was obtained.

Synthesis Example 24

Synthesis of Polymer I

Under dry nitrogen flow, 198 g of SiDA was dissolved in 600 g of NMP, and 123.6 g of ODPA and 78.2 g of maleic anhydride were added thereto. The mixture was stirred for 8 hours, while its temperature was controlled to be in the range of 10° C. to 30° C., so that a solution of a polyimide precursor (named polymer I) was obtained.

Synthesis Example 25

Synthesis of Polymer J

Under dry nitrogen flow, 13.90 g (0.023 mol) of the hydroxyl group-containing diamine (b) obtained in Synthesis Example 2 was dissolved in 50 g of NMP. To the solution were added 17.5 g (0.025 mol) of the hydroxyl group-containing acid anhydride (a) obtained in Synthesis Example 1 and 30 g of pyridine, and the mixture was allowed to react at 40° C. for 2 hours. A solution prepared by diluting 7.35 g (0.05 mol) of N,N-dimethylformamide diethyl acetal with 5 g of NMP was then added dropwise thereto over 10 minutes. After the addition, the mixture was stirred at 40° C. for 2 hours. After the reaction was completed, the solution was added to 2 L of water, and the resulting polymer solid precipitate was collected by filtration. The polymer solid was dried at 80° C. for 72 hours using a vacuum drier so that a polyimide precursor (named polymer J) was obtained.

Synthesis Example 26

Synthesis of Polymer K

Under dry nitrogen flow, 15.13 g (0.040 mol) of the hydroxyl group-containing diamine compound (c) obtained in Synthesis Example 3 and 1.24 g (0.005 mol) of SiDA were dissolved in 50 g of NMP. To the solution were added 15.51 g (0.05 mol) of 3,3',4,4'-diphenylethertetracarboxylic acid anhydride (ODPA) and 21 g of NMP, and the mixture was allowed to react at 20° C. for 1 hour and then at 50° C. for 1 hour. A solution prepared by diluting 13.2 g (0.09 mol) of N,N-dimethylformamide diethyl acetal with 15 g of NMP was then added dropwise thereto over 10 minutes. After the addition, the mixture was stirred at 40° C. for 3 hours. After the reaction was completed, the solution was added to 2 L of water, and the resulting polymer solid precipitate was collected by filtration. The polymer solid was dried at 80° C. for 72 hours using a vacuum drier so that a polyimide precursor (named polymer K) was obtained.

Synthesis Example 27

Synthesis of Polymer L

Under dry nitrogen flow, 4.37 g (0.018 mol) of the hydroxyl group-containing diamine compound (d) obtained in Synthesis Example 4, 4.51 g (0.0225 mol) of DAE and 0.62 g (0.0025 mol) of SiDA were dissolved in 70 g of NMP. To the solution were added 24.99 g (0.035 mol) of the hydroxyl group-containing acid anhydride (a) obtained in Synthesis Example 1, 4.41 g (0.010 mol) of 3,3',4,4'-biphenyltetracarboxylic acid dianhydride (BPDA) and 25 g of NMP at room temperature, and the mixture was stirred at room temperature for 1 hour and then at 40° C. for 1 hour. A solution prepared by diluting 13.09 g (0.11 mol) of N,N-dimethylformamide dimethyl acetal with 5 g of NMP was then added dropwise thereto over 10 minutes. After the addition, the mixture was stirred at 40° C. for 3 hours. After the reaction was completed, the solution was added to 2 L of water, and the resulting polymer solid precipitate was collected by filtration. The polymer solid was dried at 80° C. for 72 hours using a vacuum drier so that a polyimide precursor (named polymer L) was obtained.

Synthesis Example 28

Synthesis of Polymer M

Under dry nitrogen flow, 18.31 g (0.050 mol) of BAHF and 19.70 g (0.040 mol) of a dicarboxylic acid derivative produced by the reaction of 1 mol of diphenylether-4,4'-dicarboxylic acid dichloride (DEDC) with 2 mol of 1-hydroxybenzotriazole were dissolved in 200 g of NMP, and the solution was stirred at 75° C. for 12 hours so that the reaction was completed. After the reaction was completed, the solution was added to 3 L of a solution of water and methanol (3:1), and the resulting polymer solid precipitate was collected by filtration. The polymer solid was dried at 80° C. for 20 hours using a vacuum drier so that a polybenzoxazole precursor (named polymer M) was obtained.

Synthesis Example 29

Synthesis of Polymer N

Under dry nitrogen flow, 4.40 g (0.022 mol) of DAE and 1.24 g (0.005 mol) of SiDA were dissolved in 50 g of NMP. To the solution were added 21.4 g (0.030 mol) of the hydroxy group-containing acid anhydride (a) obtained in Synthesis Example 1 and 14 g of NMP, and the mixture was allowed to react at 20° C. for 1 hour and then at 40° C. for 2 hours. Thereafter, 0.71 g (0.006 mol) of 4-ethynylaniline as an end capping agent was added thereto, and the mixture was further allowed to react at 40° C. for 1 hour. A solution prepared by diluting 7.14 g (0.06 mol) of N,N-dimethylformamide dimethyl acetal with 5 g of NMP was then added dropwise thereto over 10 minutes. After the addition, the mixture was stirred at 40° C. for 3 hours. After the reaction was completed, the solution was added to 2 L of water, and the resulting polymer solid precipitate was collected by filtration. The polymer solid was dried at 50° C. for 72 hours using a vacuum drier so that a polyimide precursor (named polymer N) was obtained.

Example 1

A varnish of a photosensitive resin composition was obtained by dissolving 7 g of novolac resin A, 3 g of solid polymer A, 2.2 g of a quinone diazide compound (MG-300 (trade name) manufactured by Toyo Gosei Co., Ltd.), 1.5 g of NIKALAC MX-290 (trade name, manufactured by Sanwa Chemical Co., Ltd.), and 0.3 g of vinyltrimethoxysilane in 30 g of GBL. The patterning property, storage stability and mechanical properties were evaluated as described above using the resulting varnish.

Example 2

A varnish of a photosensitive resin composition was obtained by dissolving 6 g of novolac resin B, 4 g of solid polymer B, 2 g of quinone diazide compound (f), 2.5 g of NIKALAC MX-270 (trade name, manufactured by Sanwa Chemical Co., Ltd.), and 0.3 g of N-phenylaminopropyltrimethoxysilane in 30 g of GBL. The patterning property, storage stability and mechanical properties were evaluated as described above using the resulting varnish.

Example 3

A varnish of a photosensitive resin composition was obtained by dissolving 6 g of novolac resin C, 4 g of solid polymer C, 1.5 g of quinone diazide compound (e), 2.0 g of HMOM-TPHAP (trade name, manufactured by Honshu Chemical Industry Co., Ltd.), and 0.3 g of m-acetylaminophenyltrimethoxysilane in 25 g of GBL and 5 g of ethyl lactate (EL). The patterning property, storage stability and mechanical properties were evaluated as described above using the resulting varnish.

Example 4

A varnish of a photosensitive resin composition was obtained by dissolving 6.5 g of novolac resin B, 3.5 g of solid polymer D, 2 g of MG-300 (a quinone diazide compound), 1.0 g of HMOM-TPPA (trade name, manufactured by Honshu Chemical Industry Co., Ltd.), and 0.2 g of N-phenylaminopropyltrimethoxysilane in 30 g of GBL. The patterning property, storage stability and mechanical properties were evaluated as described above using the resulting varnish.

Example 5

A varnish of a photosensitive resin composition was obtained by dissolving 8 g of novolac resin A, 2 g of solid polymer E, 2 g of quinone diazide compound (e), 1.0 g of NIKALAC MX-270, 1.5 g of TrisP-PA (trade name, manufactured by Honshu Chemical Industry Co., Ltd.), and 0.2 g of vinyltriethoxysilane in 30 g of NMP. The patterning property, storage stability and mechanical properties were evaluated as described above using the resulting varnish.

Example 6

A varnish was obtained using the process of Example 1, except that 4 g of novolac resin A and 6 g of solid polymer A were used instead. The patterning property, storage stability and mechanical properties were evaluated as described above.

Example 7

A varnish was obtained using the process of Example 1, except that 7 g of novolac resin D obtained in Synthesis Example 15 was used in place of 7 g of novolac resin A. The patterning property, storage stability and mechanical properties were evaluated as described above.

Example 8

A varnish was obtained using the process of Example 2, except that 2.5 g of NIKALAC MX-290 was used in place of 2.5 g of NIKALAC MX-270. The patterning property, storage stability and mechanical properties were evaluated as described above.

Example 9

A varnish was obtained using the process of Example 1, except that 7 g of novolac resin B was used in place of 7 g of novolac resin A. The patterning property, storage stability and mechanical properties were evaluated as described above.

Example 10

A varnish was obtained using the process of Example 1, except that 7 g of novolac resin C was used in place of 7 g of novolac resin A. The patterning property, storage stability and mechanical properties were evaluated as described above.

Example 11

A varnish was obtained using the process of Example 1, except that 5 g of novolac resin A and 5 g of solid polymer A were used instead. The patterning property, storage stability and mechanical properties were evaluated as described above.

Example 12

A varnish was obtained using the process of Example 1, except that 5.6 g of novolac resin A and 4.4 g of solid polymer A were used instead. The patterning property, storage stability and mechanical properties were evaluated as described above.

Example 13

A varnish was obtained using the process of Example 1, except that 7.4 g of novolac resin A and 2.6 g of solid polymer A were used instead. The patterning property, storage stability and mechanical properties were evaluated as described above.

Example 14

A varnish was obtained using the process of Example 3, except that 0.5 g of HMOM-TPHAP was used instead. The patterning property, storage stability and mechanical properties were evaluated as described above.

Example 15

A varnish was obtained using the process of Example 3, except that 1.0 g of HMOM-TPHAP was used instead. The patterning property, storage stability and mechanical properties were evaluated as described above.

Example 16

A varnish was obtained using the process of Example 3, except that 3.0 g of HMOM-TPHAP was used instead. The patterning property, storage stability and mechanical properties were evaluated as described above.

Example 17

A varnish was obtained using the process of Example 3, except that 4.0 g of HMOM-TPHAP was used instead. The patterning property, storage stability and mechanical properties were evaluated as described above.

Example 18

A varnish was obtained using the process of Example 3, except that 5.0 g of HMOM-TPHAP was used instead. The patterning property, storage stability and mechanical properties were evaluated as described above.

Comparative Example 1

A varnish was obtained using the process of Example 1, except that 3 g of solid polymer F was used in place of 3 g of solid polymer A. The patterning property, storage stability and mechanical properties were evaluated as described above.

Comparative Example 2

A varnish was obtained using the process of Example 2, except that 22.3 g of the polymer G solution was used in place of 4 g of solid polymer B and that 15 g of GBL was used instead. The patterning property, storage stability and mechanical properties were evaluated as described above.

Comparative Example 3

A varnish was obtained using the process of Example 3, except that 20 g of the polymer H solution was used in place of 4 g of solid polymer C and that 10 g of GBL was used instead. The patterning property, storage stability and mechanical properties were evaluated as described above.

Comparative Example 4

A varnish was obtained using the process of Example 4, except that 8.7 g of the polymer I solution was used in place of 3.5 g of solid polymer D and that 25 g of GBL was used instead. The patterning property, storage stability and mechanical properties were evaluated as described above.

Comparative Example 5

A varnish was obtained using the process of Example 2, except that NIKALAC MX-270 was not used. The patterning property, storage stability and mechanical properties were evaluated as described above.

Comparative Example 6

A varnish was obtained using the process of Example 3, except that 4 g of solid polymer F was used in place of 4 g of solid polymer C and that HMOM-TPHAP was not used. The patterning property, storage stability and mechanical properties were evaluated as described above.

Comparative Example 7

A varnish was obtained using the process of Example 2, except that 22.3 g of the polymer G solution was used in place of 4 g of solid polymer B, 2,6-dimethylol-p-cresol was used in place of NIKALAC MX-270, and 15 g of GBL was used instead. The patterning property, storage stability and mechanical properties were evaluated as described above.

Comparative Example 8

A varnish was obtained using the process of Example 3, except that 20 g of the polymer H solution was used in place of 4 g of solid polymer C, 2.0 g of 2,2-bis(4-hydroxy-3,5-dihydroxymethylphenyl)propane was used in place of 2.0 g of HMOM-TPHAP, and 10 g of GBL was used instead. The patterning property, storage stability and mechanical properties were evaluated as described above.

Comparative Example 9

A varnish was obtained using the process of Example 2, except that 2.5 g of 2,2-bis(4-hydroxy-3,5-dihydroxymethylphenyl)propane was used in place of 2.5 g of NIKALAC MX-270. The patterning property, storage stability and mechanical properties were evaluated as described above.

The photosensitizer, the phenolic hydroxyl group-containing compound and the alkoxymethyl group-containing compound used in each of the examples and the comparative examples are shown below.

[Formula 27]

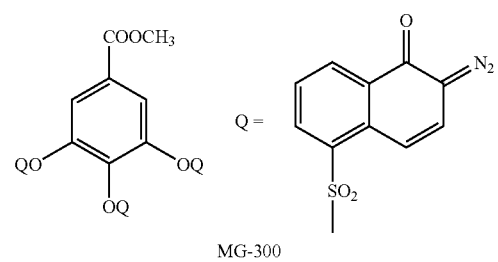

MG-300

-continued

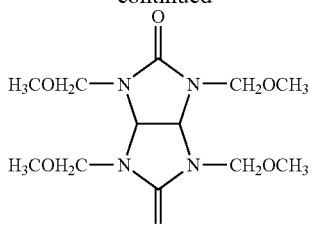

NIKALAC MX-270

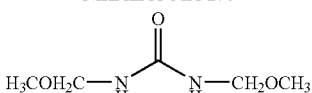

NIKALAC MX-270

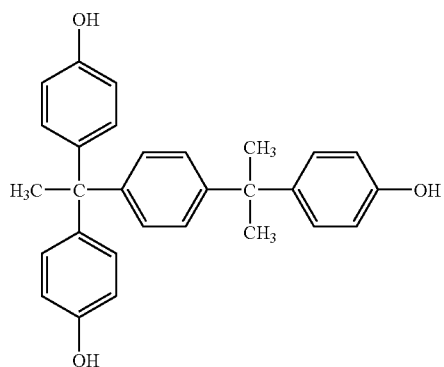

TrisP-PA

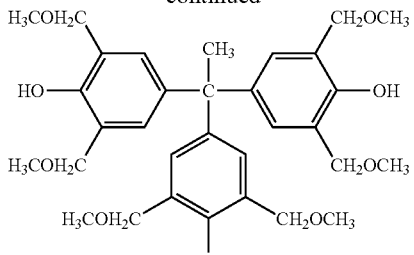

HMOM-TPHAP

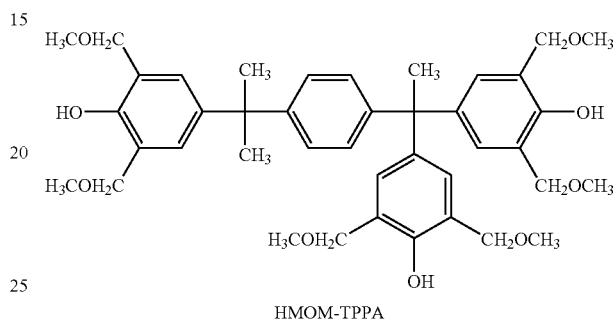

HMOM-TPPA

The compositions of Examples 1 to 18 and Comparative Examples 1 to 9 and the results of the evaluation are shown in Tables 1 to 3.

TABLE 1

|  | (a) Novolac resin | (b) Polymer | (c) Quinone diazide compound | (d) Alkoxymethyl group-containing compound | (e) Solvent | (f) Silane compound | Other components |
|---|---|---|---|---|---|---|---|
| Example 1 | A 7 g | A 3 g | MG-300 2.2 g | NIKALAC MX-290 1.5 g | GBL 30 g | Vinyltrimethoxysilane 0.3 g | — |
| Example 2 | B 6 g | B 4 g | Quinone diazide (f) 2 g | NIKALAC MX-270 2.5 g | GBL 30 g | N-phenylaminopropyl trimethoxysilane 0.3 g | — |
| Example 3 | C 6 g | C 4 g | Quinone diazide (e) 1.5 g | HMOM-TPHAP 2.0 g | GBL 25 g EL 5 g | m-acetylaminophenyl trimethoxysilane 0.3 g | — |
| Example 4 | B 6.5 g | D 3.5 g | MG-300 2 g | HMOM-TPPA 1.0 g | GBL 30 g | N-phenylaminopropyl trimethoxysilane 0.2 g | — |
| Example 5 | A 8 g | E 2 g | Quinone diazide (e) 2 g | NIKALAC MX-270 1.0 g | NMP 30 g | Vinyltriethoxysilane 0.2 g | TrisP-PA 1.5 g |
| Example 6 | A 4 g | A 6 g | MG-300 2.2 g | NIKALAC MX-290 1.5 g | GBL 30 g | Vinyltrimethoxysilane 0.3 g | — |
| Example 7 | D 7 g | A 3 g | MG-300 2.2 g | NIKALAC MX-290 1.5 g | GBL 30 g | Vinyltrimethoxysilane 0.3 g | — |
| Example 8 | B 6 g | B 4 g | Quinone diazide (f) 2 g | NIKALAC MX-290 2.5 g | GBL 30 g | N-phenylaminopropyl trimethoxysilane 0.3 g | — |
| Example 9 | B 7 g | A 3 g | MG-300 2.2 g | NIKALAC MX-290 1.5 g | GBL 30 g | Vinyltrimethoxysilane 0.3 g | — |
| Example 10 | C 7 g | A 3 g | MG-300 2.2 g | NIKALAC MX-290 1.5 g | GBL 30 g | Vinyltrimethoxysilane 0.3 g | — |
| Example 11 | A 5 g | A 5 g | MG-300 2.2 g | NIKALAC MX-290 1.5 g | GBL 30 g | Vinyltrimethoxysilane 0.3 g | — |
| Example 12 | A 5.6 g | A 4.4 g | MG-300 2.2 g | NIKALAC MX-290 1.5 g | GBL 30 g | Vinyltrimethoxysilane 0.3 g | — |
| Example 13 | A 7.4 g | A 2.6 g | MG-300 2.2 g | NIKALAC MX-290 1.5 g | GBL 30 g | Vinyltrimethoxysilane 0.3 g | — |
| Example 14 | C 6 g | C 4 g | Quinone diazide (e) 1.5 g | HMOM-TPHAP 0.5 g | GBL 25 g EL 5 g | m-acetylaminophenyl trimethoxysilane 0.3 g | — |

TABLE 2

| | (a) Novolac resin | (b) Polymer | (c) Quinone diazide compound | (d) Alkoxymethyl group-containing compound | (e) Solvent | (f) Silane compound | Other components |
|---|---|---|---|---|---|---|---|
| Example 15 | C 6 g | C 4 g | Quinone diazide (e) 1.5 g | HMOM-TPHAP 1.0 g | GBL 25 g EL 5 g | m-acetylaminophenyl trimethoxysilane 0.3 g | — |
| Example 16 | C 6 g | C 4 g | Quinone diazide (e) 1.5 g | HMOM-TPHAP 3.0 g | GBL 25 g EL 5 g | m-acetylaminophenyl trimethoxysilane 0.3 g | — |
| Example 17 | C 6 g | C 4 g | Quinone diazide (e) 1.5 g | HMOM-TPHAP 4.0 g | GBL 25 g EL 5 g | m-acetylaminophenyl trimethoxysilane 0.3 g | — |
| Example 18 | C 6 g | C 4 g | Quinone diazide (e) 1.5 g | HMOM-TPHAP 5.0 g | GBL 25 g EL 5 g | m-acetylaminophenyl trimethoxysilane 0.3 g | — |
| Comparative Example 1 | A 7 g | — | MG-300 2.2 g | NIKALAC MX-290 1.5 g | GBL 30 g | Vinyltrimethoxysilane 0.3 g | Polymer F 3 g |
| Comparative Example 2 | B 6 g | — | Quinone diazide (f) 2 g | NIKALAC MX-270 2.5 g | GBL 15 g | N-phenylaminopropyl trimethoxysilane 0.3 g | Polymer G 22.3 g |
| Comparative Example 3 | C 6 g | — | Quinone diazide (e) 1.5 g | HMOM-TPHAP 2.0 g | GBL 10 g EL 5 g | m-acetylaminophenyl trimethoxysilane 0.3 g | Polymer H 20 g |
| Comparative Example 4 | B 6.5 g | — | MG-300 2 g | HMOM-TPPA 1.0 g | GBL 25 g | N-phenylaminopropyl trimethoxysilane 0.2 g | Polymer 18.7 g |
| Comparative Example 5 | B 6 g | B 4 g | Quinone diazide (f) 2 g | — | GBL 30 g | N-phenylaminopropyl trimethoxysilane 0.3 g | — |
| Comparative Example 6 | C 6 g | — | Quinone diazide (e) 1.5 g | — | GBL 25 g EL 5 g | m-acetylaminophenyl trimethoxysilane 0.3 g | Polymer F 3 g |
| Comparative Example 7 | B 6 g | — | Quinone diazide (f) 2 g | — | GBL 15 g | N-phenylaminopropyl trimethoxysilane 0.3 g | Polymer G 22.3 g 2,6-dimethylol-p-cresol 2.5 g |
| Comparative Example 8 | C 6 g | — | Quinone diazide (e) 1.5 g | — | GBL 10 g EL 5 g | m-acetylaminophenyl trimethoxysilane 0.3 g | Polymer H 20 g 2,2-bis(4-hydroxy-3,5-dihydroxymethyl-phenyl)propane 2.0 g |
| Comparative Example 9 | B 6 g | B 4 g | Quinone diazide (f) 2 g | — | GBL 30 g | N-phenylaminopropyl trimethoxysilane 0.3 g | 2,2-bis(4-hydroxy-3,5-dihydroxymethyl-phenyl)propane 2.5 g |

TABLE 3

| | Patterning property Eop1 (mJ/cm$^2$) | Storage stability T1-T2 (μm) | Storage stability Eop2-Eop1 (mJ/cm$^2$) | Mechanical properties Maximum stress (MPa) | Mechanical properties Elastic modulus (GPa) | Mechanical properties Elongation (%) |
|---|---|---|---|---|---|---|
| Example 1 | 200 | 0 | 10 | 145 | 3.4 | 24 |
| Example 2 | 180 | 0.1 | 0 | 148 | 3.5 | 18 |
| Example 3 | 220 | 0 | 10 | 143 | 3.9 | 25 |
| Example 4 | 200 | 0.1 | 20 | 138 | 3.3 | 20 |
| Example 5 | 260 | 0.2 | 30 | 137 | 3.3 | 16 |
| Example 6 | 350 | 0.3 | 50 | 139 | 3.2 | 28 |
| Example 7 | 510 | 0.1 | 10 | 140 | 3.4 | 19 |
| Example 8 | 180 | 0 | 0 | 148 | 3.4 | 11 |
| Example 9 | 180 | 0 | 0 | 140 | 3.4 | 25 |
| Example 10 | 180 | 0 | 0 | 142 | 3.4 | 23 |
| Example 11 | 300 | 0.1 | 30 | 140 | 3.5 | 25 |
| Example 12 | 230 | 0 | 10 | 141 | 3.7 | 21 |
| Example 13 | 180 | 0 | 0 | 149 | 4.0 | 10 |
| Example 14 | 230 | 0.1 | 0 | 130 | 3.5 | 11 |
| Example 15 | 230 | 0 | 10 | 140 | 3.5 | 20 |
| Example 16 | 200 | 0 | 10 | 145 | 3.4 | 24 |
| Example 17 | 220 | 0 | 0 | 144 | 3.5 | 17 |
| Example 18 | 250 | 0.1 | 0 | 150 | 4.0 | 10 |
| Comparative Example 1 | 300 | 0.1 | 10 | Too brittle to measure | | |
| Comparative Example 2 | 350 | 0.5 | 20 | Too brittle to measure | | |
| Comparative Example 3 | 290 | 0.6 | 30 | Too brittle to measure | | |
| Comparative Example 4 | 300 | 1.0 | 30 | Too brittle to measure | | |
| Comparative Example 5 | 200 | 0.2 | 20 | Too brittle to measure | | |
| Comparative Example 6 | 220 | 0.1 | 20 | Too brittle to measure | | |
| Comparative Example 7 | 340 | 0.7 | 200 | Too brittle to measure | | |

TABLE 3-continued

|  | Patterning property Eop1 (mJ/cm²) | Storage stability | | Mechanical properties | | |
|---|---|---|---|---|---|---|
| | | T1-T2 (μm) | Eop2-Eop1 (mJ/cm²) | Maximum stress (MPa) | Elastic modulus (GPa) | Elongation (%) |
| Comparative Example 8 | 300 | 0.9 | 180 | Too brittle to measure | | |
| Comparative Example 9 | 200 | 0.5 | 210 | 144 | 3.3 | 10 |

Example 19

Weighed were 6 g of novolac resin A, 4 g of polymer A, 2 g of quinone diazide compound (g), 2.5 g of NIKALAC MX-270, and 0.3 g of vinyltrimethoxysilane. They were dissolved in 30 g of GBL so that a varnish of a photosensitive resin composition was obtained. The patterning property, storage stability, mechanical properties, and the pattern profile after the heat curing were then evaluated as described above using the resulting varnish.

Example 20

Weighed were 6 g of novolac resin A, 4 g of polymer A, 2 g of quinone diazide compound (k), 2.5 g of NIKALAC MX-270, and 0.3 g of vinyltrimethoxysilane. They were dissolved in 30 g of GBL so that a varnish of a photosensitive resin composition was obtained. The patterning property, storage stability, mechanical properties, and the pattern profile after the heat curing were then evaluated as described above.

Example 21

Weighed were 6 g of novolac resin A, 4 g of polymer N, 2 g of quinone diazide compound (i), 2.5 g of NIKALAC MX-270, and 0.3 g of vinyltrimethoxysilane. They were dissolved in 30 g of GBL so that a varnish of a photosensitive resin composition was obtained. The patterning property, storage stability, mechanical properties, and the pattern profile after the heat curing were then evaluated as described above.

Example 22

Weighed were 6 g of novolac resin C, 4 g of polymer C, 2 g of quinone diazide compound (i), 2.5 g of HMOM-TPHAP, and 0.3 g of vinyltrimethoxysilane. They were dissolved in 30 g of GBL so that a varnish of a photosensitive resin composition was obtained. The patterning property, storage stability, mechanical properties, and the pattern profile after the heat curing were then evaluated as described above.

Example 23

Weighed were 4 g of novolac resin A, 6 g of polymer N, 2 g of quinone diazide compound (i), 2.5 g of NIKALAC MX-270, and 0.3 g of vinyltrimethoxysilane. They were dissolved in 30 g of GBL so that a varnish of a photosensitive resin composition was obtained. The patterning property, storage stability, mechanical properties, and the pattern profile after the heat curing were then evaluated as described above.

Example 24

Weighed were 7 g of novolac resin A, 3 g of polymer N, 2.2 g of quinone diazide compound (i), 1.0 g of NIKALAC MX-270, and 0.3 g of vinyltrimethoxysilane. They were dissolved in 30 g of GBL so that a varnish of a photosensitive resin composition was obtained. The patterning property, storage stability, mechanical properties, and the pattern profile after the heat curing were then evaluated as described above.

Example 25

A varnish was obtained using the process of Example 19, except that 2 g of quinone diazide compound (h) was used in place of 2 g of quinone diazide compound (g). The patterning property, storage stability, mechanical properties, and the pattern profile after the heat curing were evaluated as described above.

Example 26

A varnish was obtained using the process of Example 19, except that 2 g of quinone diazide compound (i) was used in place of 2 g of quinone diazide compound (g). The patterning property, storage stability, mechanical properties, and the pattern profile after the heat curing were evaluated as described above.

Example 27

A varnish was obtained using the process of Example 19, except that 2 g of quinone diazide compound (j) was used in place of 2 g of quinone diazide compound (g). The patterning property, storage stability, mechanical properties, and the pattern profile after the heat curing were evaluated as described above.

Example 28

A varnish was obtained using the process of Example 19, except that 2 g of quinone diazide compound (k) was used in place of 2 g of quinone diazide compound (g). The patterning property, storage stability, mechanical properties, and the pattern profile after the heat curing were evaluated as described above.

Comparative Example 10

Weighed were 6 g of novolac resin B, 4 g of polymer J, 2 g of quinone diazide compound (h), 2.5 g of NIKALAC MX-270, and 0.3 g of vinyltrimethoxysilane. They were dissolved in a mixture of 25 g of GBL and 5 g of EL so that a varnish of a photosensitive resin composition was obtained.

The patterning property, storage stability, mechanical properties, and the pattern profile after the heat curing were then evaluated as described above.

Comparative Example 11

Weighed were 6 g of novolac resin C, 4 g of polymer K, 2 g of quinone diazide compound (i), 2.5 g of NIKALAC MX-270, and 0.3 g of N-phenylaminopropylmethoxysilane. They were dissolved in 30 g of GBL so that a varnish of a photosensitive resin composition was obtained. The patterning property, storage stability, mechanical properties, and the pattern profile after the heat curing were then evaluated as described above.

Comparative Example 12

Weighed were 6 g of novolac resin A, 4 g of polymer L, 2 g of quinone diazide compound (j), 2.5 g of NIKALAC MX-270, and 0.3 g of vinyltrimethoxysilane. They were dissolved in 30 g of NMP so that a varnish of a photosensitive resin composition was obtained. The patterning property, storage stability, mechanical properties, and the pattern profile after the heat curing were then evaluated as described above.

Comparative Example 13

Weighed were 6 g of novolac resin C, 4 g of polymer M, 1.5 g of quinone diazide compound (i), 1.5 g of NIKALAC MX-290, and 0.3 g of m-acetylaminophenyltrimethoxysilane. They were dissolved in 30 g of GBL so that a varnish of a photosensitive resin composition was obtained. The patterning property, storage stability, mechanical properties, and the pattern profile after the heat curing were then evaluated as described above.

Comparative Example 14

Weighed were 7 g of novolac resin A, 2 g of quinone diazide compound (g), 2.5 g of NIKALAC MX-270, and 0.3 g of vinyltrimethoxysilane. They were dissolved in 30 g of GBL so that a varnish of a photosensitive resin composition was obtained. The patterning property, storage stability, mechanical properties, and the pattern profile after the heat curing were evaluated as described above using the resulting varnish.

Comparative Example 15

Weighed were 6 g of novolac resin B, 2 g of quinone diazide compound (h), 2.5 g of NIKALAC MX-270, and 0.3 g of vinyltrimethoxysilane. They were dissolved in a mixture of 25 g of GBL and 5 g of EL so that a varnish of a photosensitive resin composition was obtained. The patterning property, storage stability, mechanical properties, and the pattern profile after the heat curing were then evaluated as described above.

Comparative Example 16

Weighed were 10 g of polymer K, 2 g of quinone diazide compound (i), 2.5 g of NIKALAC MX-270, and 0.3 g of N-phenylaminopropylmethoxysilane. They were dissolved in 30 g of GBL so that a varnish of a photosensitive resin composition was obtained. The patterning property, storage stability, mechanical properties, and the pattern profile after the heat curing were then evaluated as described above.

Comparative Example 17

Weighed were 10 g of polymer L, 2 g of quinone diazide compound (j), 2.5 g of NIKALAC MX-270, and 0.3 g of vinyltrimethoxysilane. They were dissolved in 30 g of NMP so that a varnish of a photosensitive resin composition was obtained. The patterning property, storage stability, mechanical properties, and the pattern profile after the heat curing were then evaluated as described above.

Comparative Example 18

Weighed were 6 g of novolac resin C, 4 g of polymer K, 2 g of quinone diazide compound (e), 2.5 g of NIKALAC MX-270, and 0.3 g of N-phenylaminopropylmethoxysilane. They were dissolved in 30 g of GBL so that a varnish of a photosensitive resin composition was obtained. The patterning property, storage stability, mechanical properties, and the pattern profile after the heat curing were then evaluated as described above.

Comparative Example 19

Weighed were 6 g of novolac resin C, 4 g of polymer K, 2 g of quinone diazide compound (i), 2.5 g of NIKALAC MX-270, and 0.3 g of N-phenylaminopropylmethoxysilane. They were dissolved in 30 g of GBL so that a varnish of a photosensitive resin composition was obtained. The patterning property, storage stability, mechanical properties, and the pattern profile after the heat curing were then evaluated as described above.

Comparative Example 20

Weighed were 6 g of novolac resin A, 22.3 g of the polymer G solution, 2 g of quinone diazide compound (j), 2.5 g of NIKALAC MX-270, and 0.3 g of vinyltrimethoxysilane. They were dissolved in 30 g of NMP so that a varnish of a photosensitive resin composition was obtained. The patterning property, storage stability, mechanical properties, and the pattern profile after the heat curing were then evaluated as described above.

Comparative Example 21

Weighed were 6 g of novolac resin A, 20 g of the polymer H solution, 2 g of quinone diazide compound (f), and 2.0 g of 2,2-bis(4-hydroxy-3,5-dihydroxymethylphenyl)propane. They were dissolved in 30 g of NMP so that a varnish of a photosensitive resin composition was obtained. The patterning property, storage stability, mechanical properties, and the pattern profile after the heat curing were then evaluated as described above.

Comparative Example 22

Weighed were 6.5 g of novolac resin A, 8.7 g of the polymer I solution, 2 g of quinone diazide compound (j), 2.5 g of NIKALAC MX-270, and 0.3 g of vinyltrimethoxysilane. They were dissolved in 30 g of NMP so that a varnish of a photosensitive resin composition was obtained. The patterning property, storage stability, mechanical properties, and the pattern profile after the heat curing were then evaluated as described above.

The compositions of Examples 19 to 28 and Comparative Examples 10 to 22 are shown in Tables 4 and 5, and the results of the evaluation are shown in Table 6.

TABLE 4

|  | Novolac resin | Resin | Quinone diazide compound | Alkoxymethyl group-containing compound | Solvent | Silane compound | Other components |
|---|---|---|---|---|---|---|---|
| Example 19 | A 6 g | A 4 g | (g) 2 g | NIKALAC MX-270 2.5 g | GBL 30 g | Vinyltrimethoxysilane 0.3 g | — |
| Example 20 | A 6 g | A 4 g | (k) 2 g | NIKALAC MX-270 2.5 g | GBL 30 g | Vinyltrimethoxysilane 0.3 g | — |
| Example 21 | A 6 g | N 4 g | (i) 2 g | NIKALAC MX-270 2.5 g | GBL 30 g | Vinyltrimethoxysilane 0.3 g | — |
| Example 22 | C 6 g | C 4 g | (i) 2 g | HMOM-TPHAP 2.5 g | GBL 30 g | Vinyltrimethoxysilane 0.3 g | — |
| Example 23 | A 4 g | N 6 g | (i) 2 g | NIKALAC MX-270 2.5 g | GBL 30 g | Vinyltrimethoxysilane 0.3 g | — |
| Example 24 | A 7 g | N 3 g | (i) 2.2 g | NIKALAC MX-270 1.0 g | GBL 30 g | Vinyltrimethoxysilane 0.3 g | |
| Example 25 | A 6 g | A 4 g | (h) 2 g | NIKALAC MX-270 2.5 g | GBL 30 g | Vinyltrimethoxysilane 0.3 g | |
| Example 26 | A 6 g | A 4 g | (i) 2 g | NIKALAC MX-270 2.5 g | GBL 30 g | Vinyltrimethoxysilane 0.3 g | |
| Example 27 | A 6 g | A 4 g | (j) 2 g | NIKALAC MX-270 2.5 g | GBL 30 g | Vinyltrimethoxysilane 0.3 g | |
| Example 28 | A 6 g | A 4 g | (k) 2 g | NIKALAC MX-270 2.5 g | GBL 30 g | Vinyltrimethoxysilane 0.3 g | |

TABLE 5

|  | Novolac resin | Resin | Quinone diazide compound | Alkoxymethyl group-containing compound | Solvent | Silane compound | Other components |
|---|---|---|---|---|---|---|---|
| Comparative Example 10 | B 6 g | — | (h) 2 g | NIKALAC MX-270 2.5 g | GBL 25 g EL 5 g | Vinyltrimethoxysilane 0.3 g | Polymer J 4 g |
| Comparative Example 11 | C 6 g | — | (i) 2 g | NIKALAC MX-270 2.5 g | GBL 30 g | N-phenylaminopropylmethoxysilane 0.3 g | Polymer K 4 g |
| Comparative Example 12 | A 6 g | — | (j) 2 g | NIKALAC MX-270 2.5 g | NMP 30 g | Vinyltrimethoxysilane 0.3 g | Polymer L 4 g |
| Comparative Example 13 | C 6 g | — | (i) 1.5 g | NIKALAC MX-290 1.5 g | GBL 30 g | m-acetylaminophenyltrimethoxysilane 0.3 g | Polymer M 4 g |
| Comparative Example 14 | A 7 g | — | (g) 2 g | NIKALAC MX-270 2.5 g | GBL 30 g | Vinyltrimethoxysilane 0.3 g | — |
| Comparative Example 15 | B 6 g | — | (h) 2 g | NIKALAC MX-270 2.5 g | GBL 25 g EL 5 g | Vinyltrimethoxysilane 0.3 g | — |
| Comparative Example 16 | — | — | (i) 2 g | NIKALAC MX-270 2.5 g | GBL 30 g | N-phenylaminopropylmethoxysilane 0.3 g | Polymer K 10 g |
| Comparative Example 17 | — | — | (j) 2 g | NIKALAC MX-270 2.5 g | NMP 30 g | Vinyltrimethoxysilane 0.3 g | Polymer L 10 g |
| Comparative Example 18 | C 6 g | — | (e) 2 g | NIKALAC MX-270 2.5 g | GBL 30 g | N-phenylaminopropylmethoxysilane 0.3 g | Polymer K 4 g |
| Comparative Example 19 | C 6 g | — | (i) 2 g | — | GBL 30 g | N-phenylaminopropylmethoxysilane 0.3 g | Polymer K 4 g |
| Comparative Example 20 | A 6 g | — | (j) 2 g | NIKALAC MX-270 2.5 g | NMP 30 g | Vinyltrimethoxysilane 0.3 g | Polymer G 22.3 g |
| Comparative Example 21 | A 6 g | — | (f) 2 g | — | NMP 30 g | — | Polymer H 20 g |
| Comparative Example 22 | A 6.5 g | — | (j) 2 g | NIKALAC MX-270 2.5 g | NMP 30 g | Vinyltrimethoxysilane 0.3 g | Polymer I 8.7 g |

TABLE 6

|  | Patterning property Eop1 (mJ/cm$^2$) | Storage stability | | Mechanical properties | | | Evaluation of pattern profile characteristics after heat curing |
|---|---|---|---|---|---|---|---|
|  |  | T1-T2 (μm) | Eop2-Eop1 (mJ/cm$^2$) | Maximum stress (MPa) | Elastic modulus (GPa) | Elongation (%) |  |
| Example 19 | 180 | 0 | 10 | 144 | 3.8 | 22 | B |
| Example 20 | 400 | 0.2 | 0 | 140 | 4.0 | 19 | A |
| Example 21 | 200 | 0 | 0 | 142 | 3.9 | 25 | A |

TABLE 6-continued

| | Patterning property Eop1 (mJ/cm²) | Storage stability | | Mechanical properties | | | Evaluation of pattern profile characteristics after heat curing |
|---|---|---|---|---|---|---|---|
| | | T1-T2 (μm) | Eop2-Eop1 (mJ/cm²) | Maximum stress (MPa) | Elastic modulus (GPa) | Elongation (%) | |
| Example 22 | 200 | 0 | 10 | 140 | 3.3 | 23 | A |
| Example 23 | 400 | 0.1 | 0 | 132 | 3.5 | 28 | A |
| Example 24 | 180 | 0 | 0 | 145 | 3.9 | 18 | A |
| Example 25 | 200 | 0 | 0 | 140 | 3.8 | 20 | A |
| Example 26 | 220 | 0.1 | 0 | 142 | 3.8 | 23 | A |
| Example 27 | 250 | 0 | 0 | 144 | 3.7 | 21 | A |
| Example 28 | 400 | 0 | 0 | 140 | 3.8 | 25 | A |
| Comparative Example 10 | 200 | 0 | 0 | 138 | 3.5 | 5 | A |
| Comparative Example 11 | 200 | 0 | 0 | 135 | 3.6 | 4 | A |
| Comparative Example 12 | 240 | 0 | 20 | Too brittle to measure | | | A |
| Comparative Example 13 | 300 | 0 | 10 | 130 | 2.9 | 5 | A |
| Comparative Example 14 | 160 | 0 | 0 | Too brittle to measure | | | C |
| Comparative Example 15 | 160 | 0 | 0 | Too brittle to measure | | | C |
| Comparative Example 16 | 600 | 0.5 | 50 | 130 | 3.2 | 29 | A |
| Comparative Example 17 | 600 | 0.5 | 60 | 133 | 3.5 | 30 | A |
| Comparative Example 18 | 300 | 0.2 | 10 | 125 | 3.0 | 3 | C |
| Comparative Example 19 | 240 | 0.2 | 0 | Too brittle to measure | | | C |
| Comparative Example 20 | 300 | 0 | 0 | 138 | 3.5 | 2 | C |
| Comparative Example 21 | 340 | 0 | 0 | Too brittle to measure | | | C |
| Comparative Example 22 | 320 | 0 | 0 | 129 | 3.1 | 6 | C |

INDUSTRIAL APPLICABILITY

According to the invention, there is provided a positive-type photosensitive resin composition having good mechanical properties and high storage stability. Heat-resistant resin films produced using the positive-type photosensitive resin composition of the invention are suitable for use in applications such as passivation films for semiconductor devices, protective films for semiconductor devices, interlayer dielectric films for multilayer interconnections for high density packaging, and insulating layers for organic electro-luminescent devises.

The invention claimed is:

1. A positive-type photosensitive resin composition, comprising:
   (a) a novolac resin which comprises a cresol novolac resin having a molar ratio of m-cresol residues to p—cresol residues (m/p) of at least 1.8;
   (b) a polymer comprising, as a main component, a structure represented by formula (1) below and/or a structure represented by, formula (2) below:

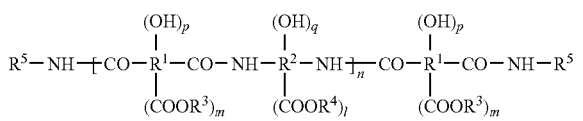

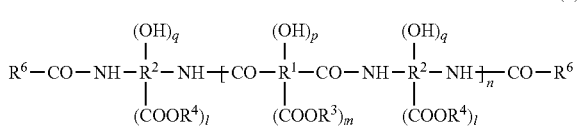

(wherein in formulae (1) and (2), $R^1$ and $R^2$ may be the same or different and each represent an organic group having at least two carbon atoms and a valence of 2 to 8, $R^3$ and $R^4$ may be the same or different and each represent hydrogen or a monovalent organic group of 1 to 20 carbon atoms, —NH—$R^5$ in formula (1) and —CO—$R^6$ in formula (2) each represent a polymer end group, $R^5$ and $R^6$ each represent a monovalent organic group having 2 to 30 carbon atoms which includes an unsaturated hydrocarbon group, n is in the range of 10 to 100,000, l and m each represent an integer of 0 to 2, and p and q each represent an integer of 0 to 4, provided that p+q>0);

(c) a quinone diazide compound;

(d) an alkoxymethyl group-containing compound; and (e) a solvent.

2. The positive-type photosensitive resin composition of claim 1, wherein the quinone diazide compound (c) comprises a compound represented by formula (3):

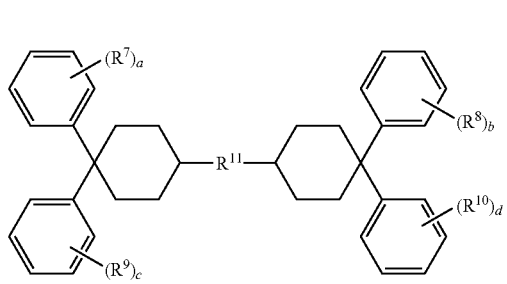

(3)

(wherein in formula (3), $R^7$ to $R^{10}$ may be the same or different and each represent hydrogen or a monovalent organic group of 1 to 10 carbon atoms, $R^{11}$ represents a divalent organic group, Q represents a 5-naphthoquinone diazide sulfonyl group, a 4-naphthoquinone diazide sulfonyl group or hydrogen, provided that not all Q moieties are hydrogen, and a, b, c, and d each represent an integer of 0 to 4).

3. The positive-type photosensitive resin composition of claim 2, wherein the molar ratio of the naphthoquinone diazide sulfonyl group represented by Q to the hydrogen represented by Q in the compound represented by formula (3) (naphthoquinone diazide sulfonyl group/hydrogen) is from 3/5 to 3.

4. The positive-type photosensitive resin composition of claim 1, wherein it comprises 30 to 100 parts by weight of the polymer (b) comprising, as a main component, the structure represented by formula (1) and/or the structure represented by formula (2) based on 100 parts by weight the novolac resin (a), and it comprises 1 to 50 parts by weight of the quinone diazide compound (c) and 5 to 50 parts by weight of the alkoxymethyl group-containing compound (d) based on 100 parts by weight of the total amount of the novolac resin (a) and the polymer (b) comprising, as a main component, the structure represented by formula (1) and/or the structure represented by formula (2).

5. The positive-type photosensitive resin composition of claim 1, wherein the alkoxymethyl group-containing compound (d) comprises:

a compound having a group represented by formula (4):

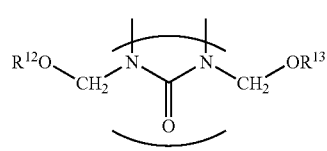

(4)

(wherein in formula (4), $R^{12}$ and $R^{13}$ each represent an alkyl group of 1 to 20 carbon atoms); and/or a compound represented by formula (5):

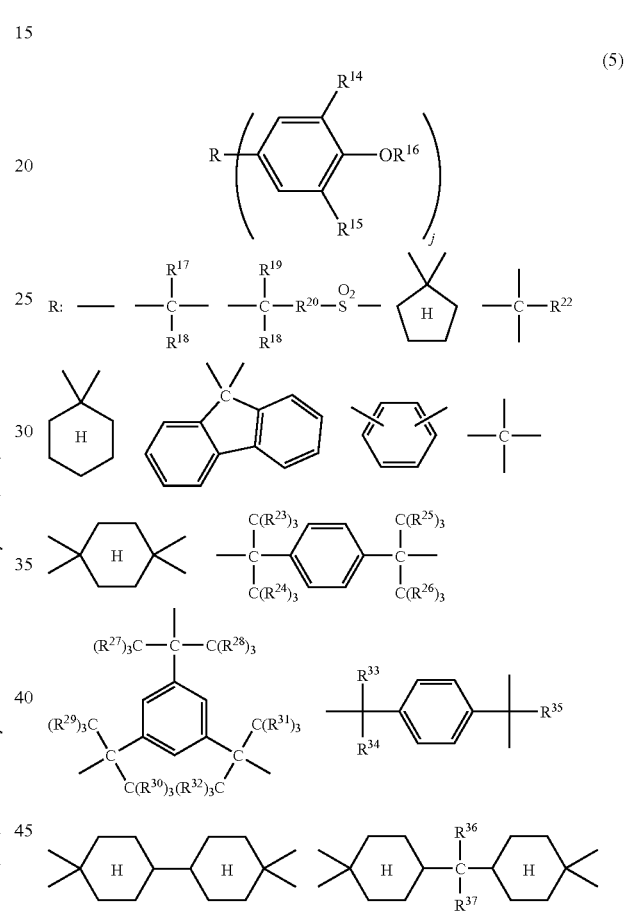

(5)

(wherein in formula (5), $R^{14}$ and $R^{15}$ each represent $CH_2OR^{38}$ (wherein $R^{38}$ represents an alkyl group of 1 to 6 carbon atoms), $R^{16}$ represents a hydrogen atom, a methyl group or an ethyl group, $R^{17}$ to $R^{37}$ may be the same or different and each represent a hydrogen atom, a monovalent organic group of 1 to 20 carbon atoms, Cl, Br, I, or F, and j represents an integer of 1 to 4).

* * * * *